(12) United States Patent
Yato et al.

(10) Patent No.: US 7,977,775 B2
(45) Date of Patent: Jul. 12, 2011

(54) SEMICONDUCTOR DEVICE AND MANUFACTURING METHOD OF THE SAME

(75) Inventors: Yuichi Yato, Tokyo (JP); Takuya Nakajo, Tokyo (JP); Hiroi Oka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 187 days.

(21) Appl. No.: 12/360,325

(22) Filed: Jan. 27, 2009

(65) Prior Publication Data
US 2009/0189264 A1  Jul. 30, 2009

(30) Foreign Application Priority Data
Jan. 28, 2008  (JP) ................................ 2008-016551

(51) Int. Cl.
*H01L 23/495* (2006.01)
(52) U.S. Cl. ............... 257/666; 257/669; 257/E23.039
(58) Field of Classification Search .............. 257/666, 257/669, E23.039
See application file for complete search history.

(56) References Cited

U.S. PATENT DOCUMENTS

| | | | |
|---|---|---|---|
| 4,935,803 A * | 6/1990 | Kalfus et al. | 257/673 |
| 5,121,187 A * | 6/1992 | Yamazaki et al. | 257/753 |
| 5,329,158 A * | 7/1994 | Lin | 257/666 |
| 6,215,176 B1 * | 4/2001 | Huang | 257/666 |
| 6,249,041 B1 * | 6/2001 | Kasem et al. | 257/666 |
| 6,307,755 B1 * | 10/2001 | Williams et al. | 361/813 |
| 7,294,912 B2 * | 11/2007 | Takeuchi et al. | 257/675 |
| 7,368,824 B2 * | 5/2008 | Hosseini et al. | 257/779 |
| 7,683,464 B2 * | 3/2010 | Sun et al. | 257/666 |
| 2005/0048758 A1 * | 3/2005 | Hosseini et al. | 438/614 |
| 2008/0146010 A1 * | 6/2008 | Hosseini et al. | 438/575 |

FOREIGN PATENT DOCUMENTS
JP   2005-277168 A   10/2005

OTHER PUBLICATIONS

Yasunari Ukita et al., "Application of Conductive Paste Containing Silver Nanoparticles to Power Transistor Package", 11*th* Symposium on Microjoining and Assembly Technology in Electronics, Feb. 2005, pp. 233-238.

* cited by examiner

*Primary Examiner* — Nitin Parekh
(74) *Attorney, Agent, or Firm* — Miles & Stockbridge P.C.

(57) ABSTRACT

The present invention enables improvement of bonding reliability of the conductive adhesive interposed between a semiconductor chip and a die pad portion. Provided is a semiconductor device, in which a silicon chip is mounted over the die pad portion integrally formed with a drain lead, has a source pad over the main surface and a drain electrode of a power MOSFET over the back side, and is bonded onto the die pad portion via an Ag paste. In the device, a source lead and the source pad are electrically coupled via an Al ribbon. Over the back surface of the silicon chip, an Ag nanoparticle coated film is formed, while another Ag nanoparticle coated film is formed over the die pad portion and lead (drain lead and source lead).

15 Claims, 30 Drawing Sheets

SEMICONDUCTOR DEVICE AND MANUFACTURING METHOD OF THE SAME

CROSS-REFERENCE RELATED APPLICATIONS

The disclosure of Japanese Patent Application No. 2008-16551 filed on Jan. 28, 2008 including the specification, drawings and abstract is incorporated herein by reference in its entirety.

BACKGROUND OF THE INVENTION

The present invention relates to a semiconductor device and a manufacturing technology thereof. In particular, the invention pertains to a technology effective when applied to a power semiconductor device having a package formed by bonding a semiconductor chip onto a die pad portion of a lead frame via a conductive adhesive.

A power MOSFET (Metal Oxide Semiconductor Field Effect Transistor) to be used for a power control switch or a charge/discharge protection circuit switch of portable information devices is sealed in a small surface mount package such as SOP8.

Such a surface mount package for power semiconductor devices has, for example, the following structure. Described specifically, a semiconductor chip having a power MOSFET is mounted, with its main surface up, over a die pad portion formed integrally with a drain lead and adhered onto a die pad portion via a conductive adhesive such as Ag paste. Over the back side of the semiconductor chip, a drain electrode coupled to the drain of the power MOSFET is formed. On the other hand, over the main surface of the semiconductor chip, a source pad and a gate pad are formed. The source pad has a wider area than the gate pad in order to reduce the on resistance of the power MOSFET. The source pad and the gate pad are each electrically coupled to a lead via an Au wire. These members (die pad portion, semiconductor chip, Au wire, and lead) are sealed with a molding resin.

Investigation results on the use, as a conductive adhesive for power semiconductor devices, of a nano-composite Ag paste material formed by mixing Ag nanoparticles with a conventional Ag paste are reported in the proceedings of the 11th Symposium on "Microjoining and Assembly Technology in Electronics", 233-238 (February, 2005).

Japanese Patent Laid-Open No. 2005-277168 discloses a package for power semiconductor devices in which a source pad of a semiconductor chip is electrically coupled to a lead via a plate-like clip made of copper or a copper alloy. In the package disclosed therein, the source pad and the clip, and the lead and the clip are adhered via a conductive adhesive. The conductive adhesive contains conductive particles made of aluminum or indium having plasticity in a binder resin and is characterized by that the particle size of a part of the conductive adhesive prior to plastic deformation by adhesion is greater than the maximum distance between the source pad and the clip and the maximum distance between the lead and the clip to be adhered.

SUMMARY OF THE INVENTION

With recent enhancement of the performance of power semiconductor devices, a further reduction in the on-resistance of a power MOSFET has been required. In order to satisfy this requirement, electrical coupling of a source pad and a lead, which was conventionally performed via an Au wire, via a metal ribbon having flexibility is under investigation. This metal ribbon is comprised of an Al foil or Cu foil having a thickness of, for example, several hundred μm. Although its width varies, depending on the width of a source pad, it is typically around 1 mm. Coupling of a source pad and a lead via a metal ribbon therefore enables a drastic reduction of a source resistance compared with that when an Au wire is used for coupling of them.

A wedge bonding process utilizing ultrasonic oscillation is used for coupling of a metal ribbon to a source pad and a lead. The ultrasonic oscillation energy applied to the surface of the source pad during bonding of the metal ribbon is by far greater (typically, from about 5 to 10 W) than that applied to the surface of the source pad during bonding via an Au wire. When the source pad and the lead are coupled to each other via the metal ribbon, a conductive adhesive such as Ag paste interposed between the semiconductor chip and the die pad portion is damaged by the ultrasonic oscillation energy, which results in inconveniences such as reduction in adhesion strength of the conductive adhesive, separation of the silicon chip from the die pad portion during bonding of the metal ribbon, or reduction in the electrical conductivity of the conductive adhesive.

An object of the invention is to provide a technology of improving bonding reliability of a conductive adhesive interposed between a semiconductor chip and a die pad portion.

Another object of the present invention is to provide a technology of promoting an increase in the capacity of a power semiconductor device.

The above-described objects and other objects, and novel features of the invention will be apparent from the description herein and accompanying drawings.

The outline of typical inventions disclosed herein will next be described briefly.

A semiconductor device according to the invention comprises a lead frame having a die pad portion and a first lead arranged in the vicinity of the die pad portion, a semiconductor chip mounted over the die pad portion with face up and having a first pad over the main surface of the semiconductor chip, a conductor for electrically coupling the first lead and the first pad, and a resin package for sealing therein the die pad portion, the semiconductor chip, the conductor, and the inner lead portion of the first lead, wherein the lead frame has, over the surface thereof, a first porous metal layer formed by baking nanoparticles of Ag; and the die pad portion is bonded to the back surface of the semiconductor chip via an Ag paste.

A manufacturing method of a semiconductor device comprises the steps of: (a) preparing a lead frame having a die pad portion and a first lead arranged in the vicinity of the die pad portion and forming a first porous metal layer formed by baking nano-particles of Ag over the surface of the lead frame; (b) preparing a semiconductor chip having, over a main surface thereof, a first pad; (c) after supply of an Ag paste onto the die pad portion, mounting the semiconductor chip over the die pad portion by using a face up system; (d) after the step (c), curing the Ag paste to bond the die pad portion and the back surface of the semiconductor chip via the Ag paste; (e) after the step (d), electrically coupling the first lead and the first pad via a conductor; and (f) after the step (e) sealing the die pad portion, the semiconductor chip, the conductor, and the inner lead portion of the first lead with a resin.

Advantages available from typical inventions disclosed herein will next be described briefly.

The invention contributes to improvement in the bonding reliability of a conductive adhesive interposed between a semiconductor chip and a die pad portion.

DETAILED DESCRIPTION OF THE PREFERRED EMBODIMENTS

Figure 1:
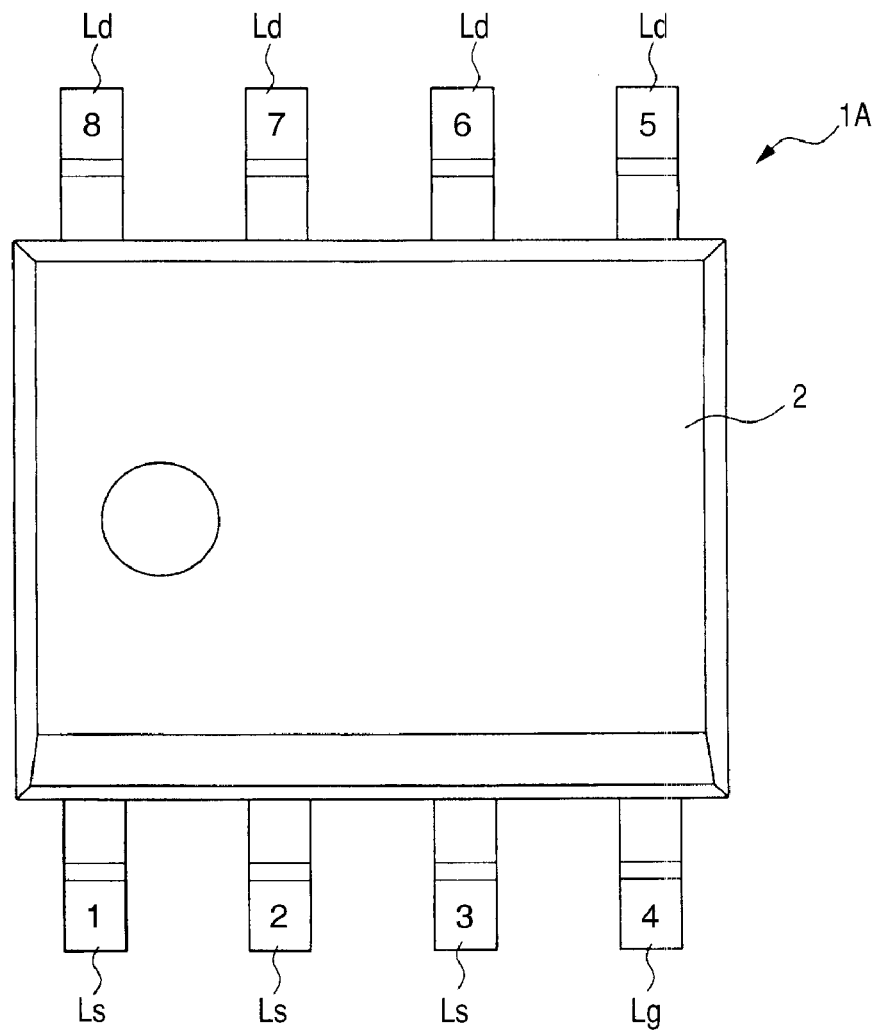
FIG. 1 is a plan view illustrating the appearance of a semiconductor device according to Embodiment 1 of the present invention.

Embodiments of the invention will hereinafter be described specifically based on some drawings. In all the drawings for describing the embodiments, like members of a function will be identified by like reference numerals and overlapping descriptions will be omitted. Moreover, in the following embodiments, a description of portions which are the same or analogous to each other is not repeated in principle unless otherwise particularly necessary.

Embodiment 1

Figure 2:
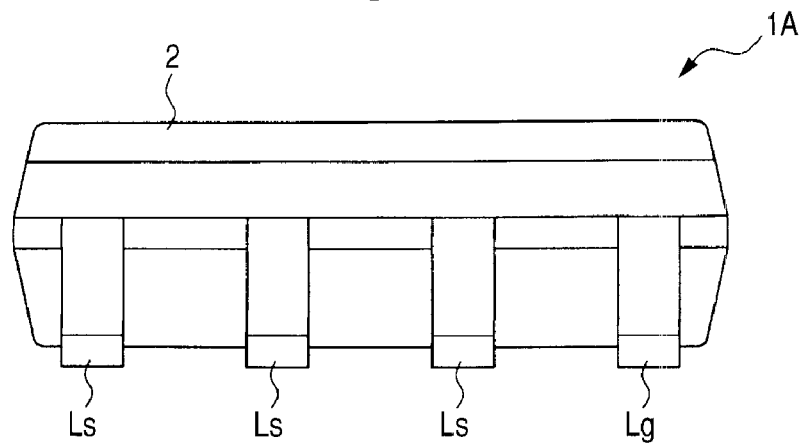
FIG. 2 is a side view illustrating the appearance of the semiconductor device according to Embodiment 1 of the present invention.
Figure 3:
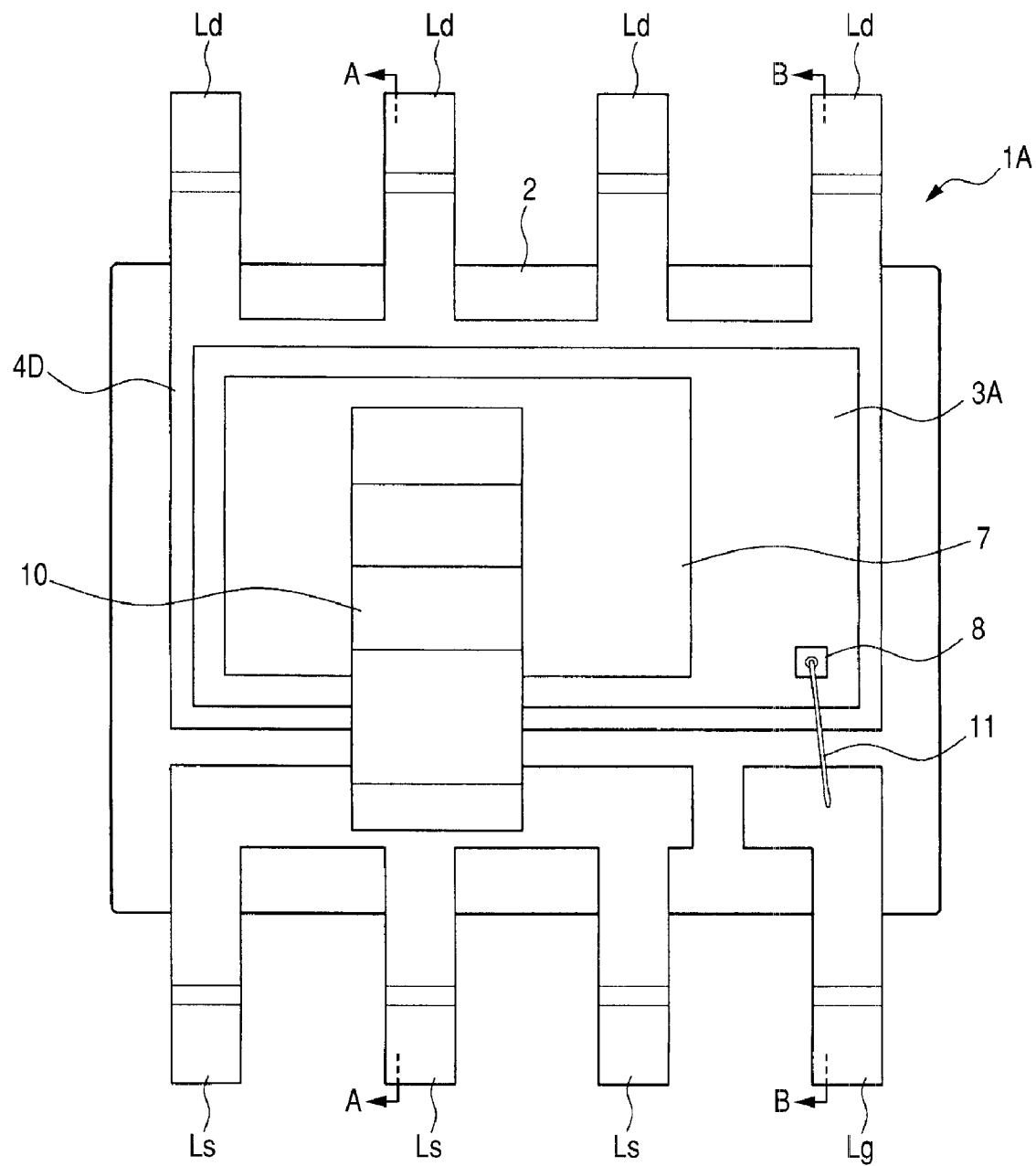
FIG. 3 is a plan view illustrating the internal structure of the semiconductor device according to Embodiment 1 of the present invention.
Figure 4:
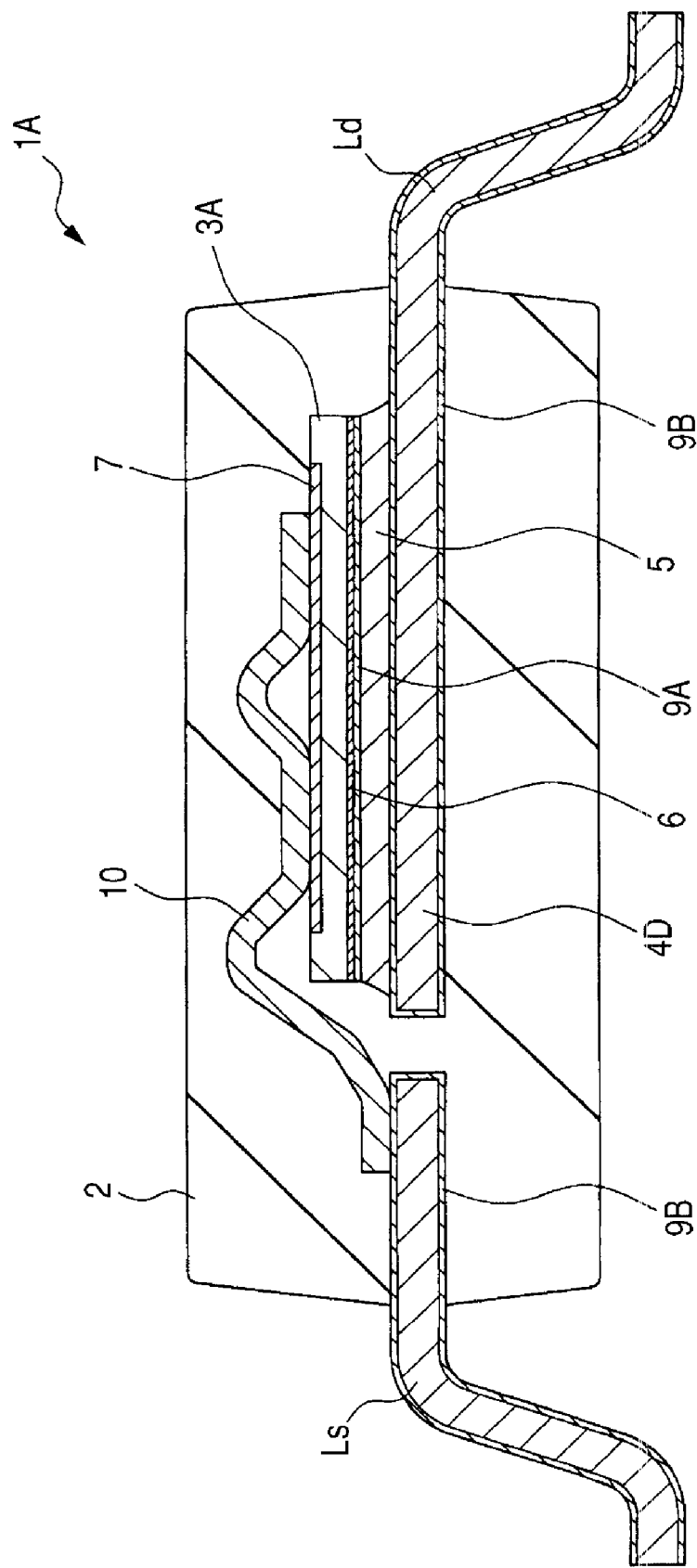
FIG. 4 is a cross-sectional view taken along a line A-A of FIG. 3.
Figure 5:
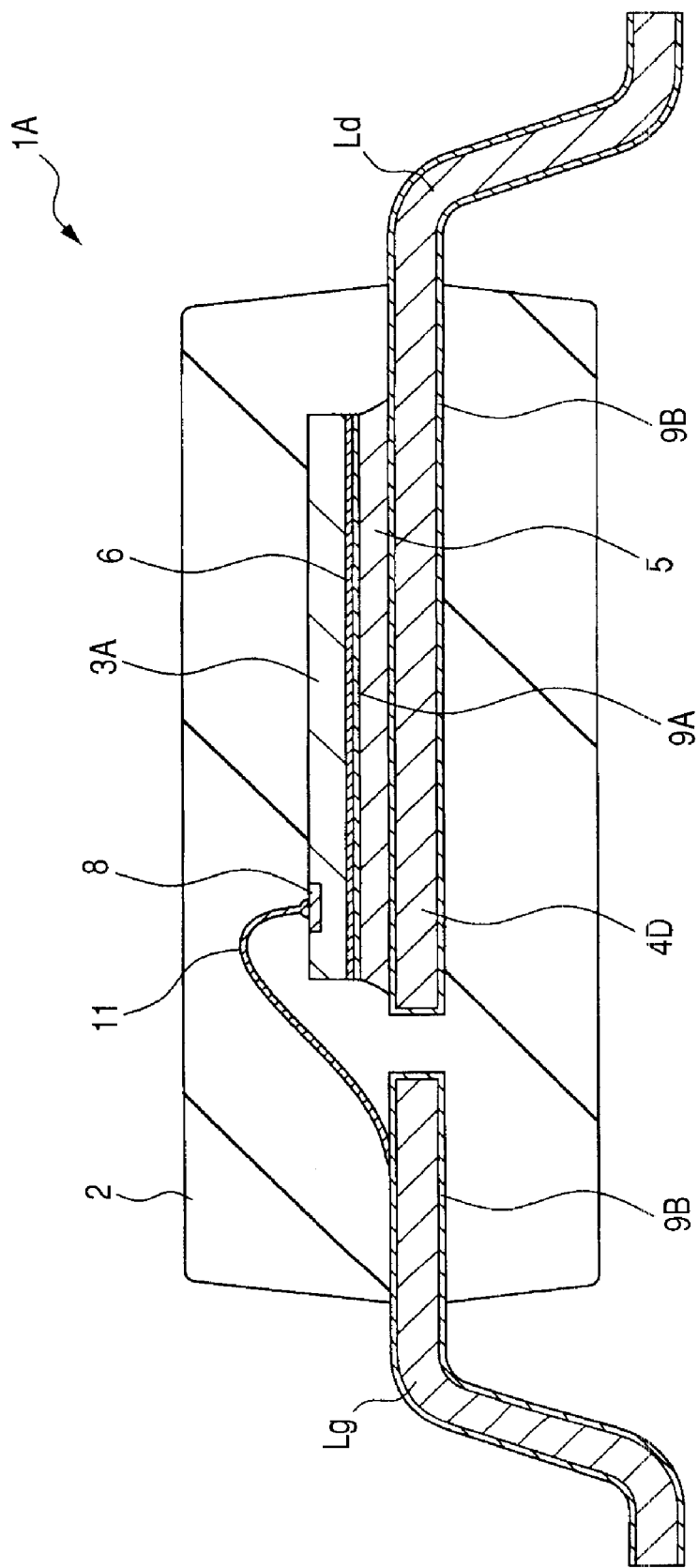
FIG. 5 is a cross-sectional view taken along a line B-B of FIG. 3.

FIGS. 1 to 5 each illustrates a semiconductor device according to this embodiment. FIG. 1 is a plan view illustrating its appearance; FIG. 2 is a side view illustrating its appearance; FIG. 3 is a plan view illustrating its internal structure; FIG. 4 is a cross-sectional view taken along a line A-A of FIG. 3; and FIG. 5 is a cross-sectional view taken along a line B-B of FIG. 3.

The semiconductor device 1A of this embodiment is applied to SOP8, one of small surface mount packages. From a molding resin 2 made of an epoxy resin, outer lead portions of eight leads L comprising external connection terminals of SOP8 are exposed. Of the leads L illustrated in FIG. 1, No. 1 to No. 3 are each a source lead Ls, No. 4 is a gate lead Lg, and No. 5 to No. 8 are each a drain lead Ld.

Inside the molding resin 2, for example, a silicon chip 3A having a planar size of, for example, 3.9 mm×2.2 mm (long side×short side) is sealed. This silicon chip 3A has, over the main surface thereof, for example, a power MOSFET to be used for a power control switch or a charge/discharge protection circuit switch of portable information devices. The configuration of this power MOSFET will be described later.

The silicon chip 3A is mounted over a die pad portion 4D integrally formed with four drain leads Ld (No. 5 lead to No. 8 lead), with the main surface up. The silicon chip 3A has, over the back side thereof, a drain electrode 6 coupled to a drain of the power MOSFET. Over the surface of the drain electrode 6, an Ag nanoparticle coated film (second porous metal layer) 9A is formed. On the other hand, the die pad portion 4D and the eight leads L (No. 1 lead to No. 8 lead) are comprised of copper and over the whole or part thereof, an Ag nanoparticle coated film (first porous metal layer) 9B is formed. An Ag paste 5 is formed between these two nanoparticle coated films 9A and 9B. In other words, the drain electrode 6 of the silicon chip 3A and the die pad portion 4D are bonded to each other via the two Ag nanoparticle coated films 9A and 9B and the Ag paste 5 interposed therebetween.

The silicon chip 3A has, over the main surface thereof, a source pad (source electrode) 7 and a gate pad 8. The source pad 7 and the gate pad 8 are each made of an Al alloy film formed as the uppermost layer of the silicon chip 3A. The source pad 7 has a greater area than the gate pad 8 has in order to reduce the on-resistance of the power MOSFET. Because of a similar reason, the entire back surface of the silicon chip 3A comprises the drain electrode 6 of the power MOSFET.

In the semiconductor device 1A of this embodiment, three source leads Ls (No. 1 lead to No. 3 lead) are linked with each other inside the molding resin 2. This link portion and the source pad 7 are electrically coupled to each other via an Al ribbon 10. The Al ribbon 10 has a thickness of about 0.1 mm and a width of about 1 mm. In order to reduce the on-resistance of the power MOSFET, it is desired to increase a contact area between the Al ribbon 10 and the source pad 7 by bringing the width of the Al ribbon 10 close to that of the source pad 7. On the other hand, the one gate lead Lg (No. 4 lead) and the gate pad 8 are electrically coupled to each other via an Au wire 11.

Figure 6:
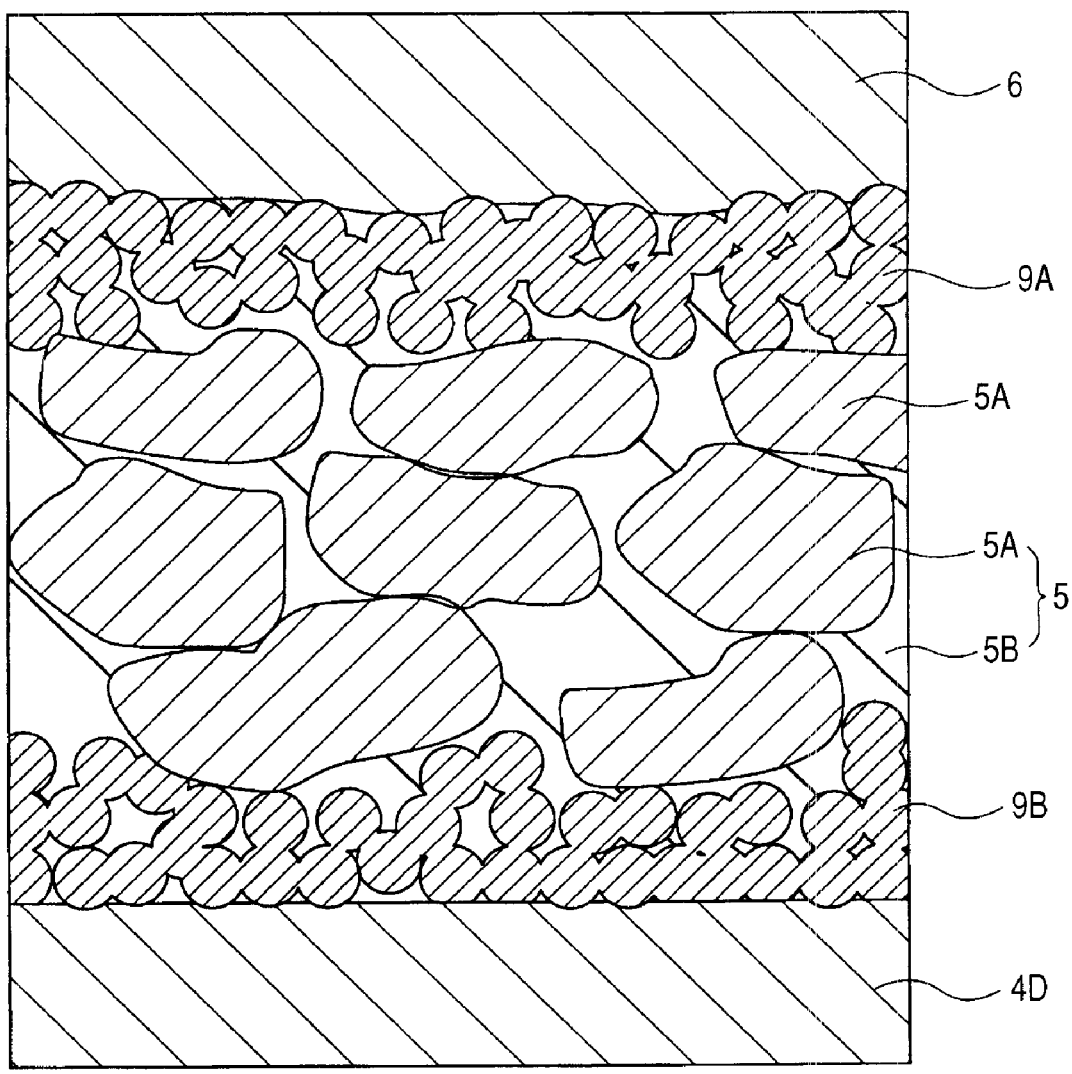
FIG. 6 is an enlarged cross-sectional view illustrating a bond area of a silicon chip and a die pad portion.

FIG. 6 is an enlarged cross-sectional view illustrating a bond portion between the silicon chip 3A and the die pad portion 4D. The drain electrode 6 is formed over the back side of the silicon chip 3A and over the surface of this drain electrode 6, the Ag nanoparticle coated film 9A is formed. Similarly, the Ag nanoparticle coated film 9B is formed over the surface of the die pad portion 4D. The drain electrode 6 is comprised of metal films formed by successively stacking a Ti film, an Ni film, and an Au film one after another in the order near the silicon chip 3A. The Au film forming the uppermost surface has a thickness of, for example, from 100 nm to 5 µm. The Ag nanoparticle coated films 9A and 9B have each a film thickness of, for example, from 100 nm to 10 µm.

On the other hand, the Ag paste 5 interposed between the Ag nanoparticle coated films 9A and 9B is comprised of a conductive resin formed by mixing an Ag filler 5A in an epoxy resin 5B and it has a film thickness of, for example, from 10 to 20 µm. A content of the Ag filler 5A in the Ag paste 5 is from 65 wt. % to 98 wt. %. When the content of the Ag filler 5A is less than 65 wt. %, the resulting Ag paste does not have sufficient electrical conduction properties. When the content exceeds 98 wt. %, the resulting Ag paste has reduced bond properties.

The Ag filler 5A contained in the Ag paste 5 has an average particle size of, for example, from 0.5 µm to 50 µm, while Ag particles comprising the Ag nanoparticle coated films 9A and 9B have an average particle size of, for example, from 1 nm to 50 nm. This means that the Ag particles are characterized by that they are much more minute than the Ag filler 5A. The Ag nanoparticle coated films 9A and 9B have a porous structure because minute Ag particles coarsen as a result of coalescence and agglomeration. They become films having a surface with many marked irregularities. The Ag paste 5 in a region contiguous to the interface between the Ag nanoparticle coated films 9A and 9B is cured while the epoxy resin 5B penetrates into the pores of the Ag nanoparticle coated films 9A and 9B. The anchor effect of the epoxy resin 5B accelerates the firm bonding between the drain electrode 6 of the silicon chip 3A and the Ag paste 5, and between the die pad portion 4D and the Ag paste 5, thereby preventing interfacial separation of the silicon chip 3A and the die pad portion 4D.

In the SOP8 of this embodiment, the Ag nanoparticle coated film 9B is formed not only over the upper surface of the die pad portion 4D over which the silicon chip 3A has been mounted, but also over the back surface of the die pad portion 4D and the entire surface of each of the eight leads L. The molding resin 2 in a region contiguous to the interface of the Ag nanoparticle coated film 9B is cured while penetrating into the pores of the Ag nanoparticle coated film 9B. Due to the anchor effect of the molding resin 2, the back surface of the die pad portion 4D and the molding resin 2, and the lead L inside the package and the molding resin 2 are bonded firmly, whereby the interfacial separation between the back surface of the die pad portion 4D and the molding resin 2 and the interfacial separation between the lead L and the molding resin 2 can be prevented.

Figure 7:
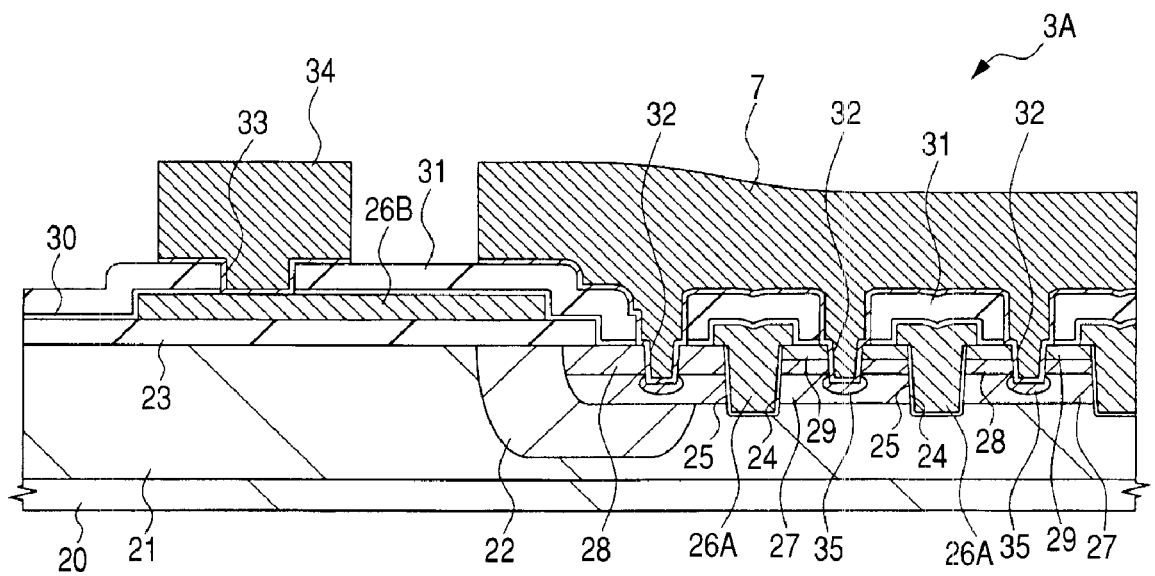
FIG. 7 is a fragmentary cross-sectional view illustrating a power MOSFET formed over a silicon chip.

The power MOSFET formed over the silicon chip 3A will next be described simply. FIG. 7 is a fragmentary cross-sectional view illustrating the silicon chip 3A which is an n-channel type trench-gate power MOSFET as one example of the power MOSFETs.

Over the main surface of an $n^+$ type single crystal silicon substrate 20, an $n^-$ type single crystal silicon layer 21 is formed by an epitaxial growth process. The $n^+$ type single crystal silicon substrate 20 and the $n^-$ type single crystal silicon layer 21 comprise a drain of the power MOSFET.

In a portion of the $n^-$ type single crystal silicon layer 21, a p well 22 is formed. Over a portion of the surface of the $n^-$ type single crystal silicon layer 21, a silicon oxide film 23 is formed, while a plurality of trenches 24 are formed in some of the other portions. A region of the surface of the $n^-$ type single crystal silicon layer 21 covered with the silicon oxide film 23 comprises an element isolation region, while a region in which the trenches 24 are formed comprise an element formation region (active region). Although not illustrated, the planar shape of each of the trenches 24 is a polygonal shape such as rectangular, hexagonal, or octagonal, or a stripe extending in one direction.

Over the bottom and side walls of the trench 24, a silicon oxide film 25 comprising a gate oxide film of the power MOSFET is formed. The trench 24 is filled with a polycrystalline silicon film 26A comprising a gate electrode of the power MOSFET. Over the silicon oxide film 23, a gate extraction electrode 26B comprised of a polycrystalline silicon film deposited in a similar step to that for the polycrystalline silicon film 26A comprising the gate electrode is formed. The gate electrode (polycrystalline silicon film 26A) and the gate extraction electrode 26B are electrically coupled to each other in an unillustrated region.

In the $n^-$ type single crystal silicon layer 21 in the element formation region, a $p^-$ type semiconductor region 27 thinner than the trench 24 is formed. The $p^-$ type semiconductor region 27 comprises a channel layer of the power MOSFET. Over the $p^-$ type semiconductor region 27, a p type semiconductor region 28 having a higher impurity concentration than that of the $p^-$ type semiconductor region 27 is formed, and over the p type semiconductor region 28, an $n^+$ type semiconductor region 29 is formed. The p type semiconductor region 28 comprises a punch-through stopper layer of the power MOSFET and the n⁻ type semiconductor region 29 comprises a source.

Over the element formation region in which the power MOSFET is formed and over the element isolation region in which the gate extraction electrode 26B is formed, two silicon oxide film layers 30 and 31 are formed. In the element formation region, a connection hole 32 penetrating the silicon oxide films 31 and 30, the p type semiconductor region 28, and the n⁺ type semiconductor region 29 and reaching the p⁻ type semiconductor region 27 are formed. In the element isolation region, a connection hole 33 penetrating the silicon oxide films 31 and 30 and reaching the gate extraction electrode 26B is formed.

Over the silicon oxide film including the inside of the connection holes 32 and 33, a source pad 7 and a gate interconnect 34, each comprised of a stack of a thin TiW (titanium tungsten) film and a thick Al film are formed. The source pad 7 formed in the element formation region is electrically coupled to the source (n⁺ type semiconductor region 29) of the power MOSFET via the connection hole 32. Over the bottom of the connection hole 32, a p⁺ type semiconductor region 35 for forming an ohmic contact between the source pad 7 and the p⁻ type semiconductor region 27 is formed. The gate interconnect 34 formed in the element isolation region is coupled to the gate electrode (polycrystalline silicon film 26A) of the power MOSFET via the gate extraction electrode 26B below the connection hole 33.

The source pad 7 is electrically coupled to one end of an Al ribbon 10 by a wedge bonding process. It is desired to adjust the thickness of the source pad 7 over the silicon oxide films 32 and 33 to 3 µm or greater in order to minimize the impact on the power MOSFET during bonding of the Al ribbon 10 to the source pad 7.

Figure 8:
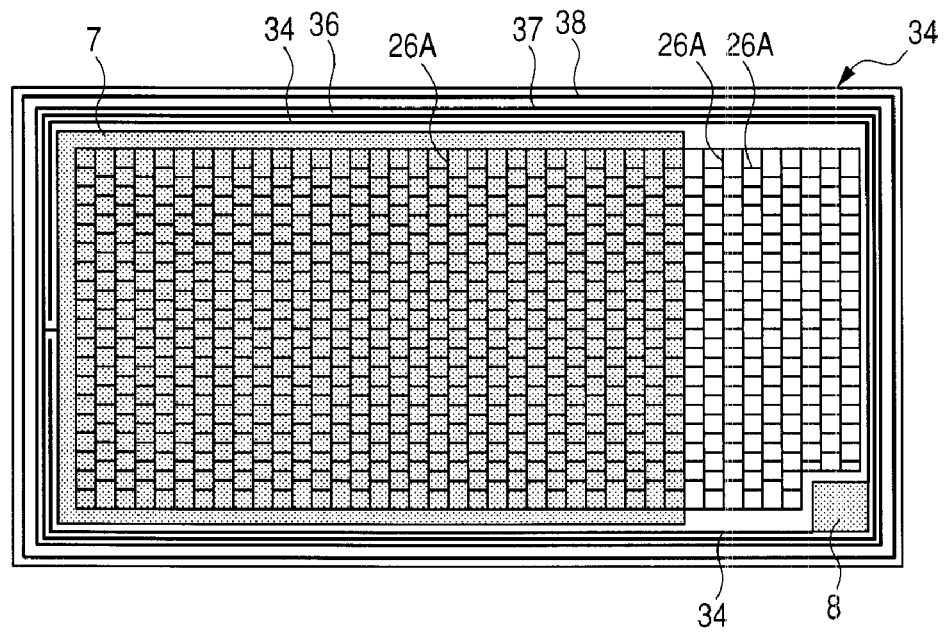
FIG. 8 is a plan view illustrating an uppermost conductive film including a source pad, a gate pad, and a gate interconnect and a lower gate electrode, each formed over the silicon chip.

FIG. 8 is a plan view illustrating the uppermost conductive films including the source pad 7, the gate pad 8, and the gate interconnect 34 and the lower gate electrode (polycrystalline silicon film 26A), each formed over the silicon chip 3A. The gate interconnect 34 is electrically coupled to the gate pad 8 and the source pad 7 is electrically coupled to an Al interconnect 36. The silicon chip 3A has, at the periphery thereof, Al interconnects 37 and 38. The gate pad 8 and Al interconnects 36, 37, and 38 are comprised of conductive films (stack of the TiW film and the Al film) and these members and the source pad 7 and the gate interconnect 34 comprise the same layer. In the actual silicon chip 3A, the gate interconnect 34 and the Al interconnects 36, 37, and 38 are covered with an unillustrated surface protective film so that only the source pad 7 and the gate pad 8, of the uppermost conductive films, are exposed from the surface of the silicon chip 3A. It should be noted that the trench 24 in which the gate electrode (polycrystalline silicon film 26A) is formed has a rectangular planar shape so that the gate electrode (polycrystalline silicon film 26A) has also a rectangular planar shape.

Figure 9:
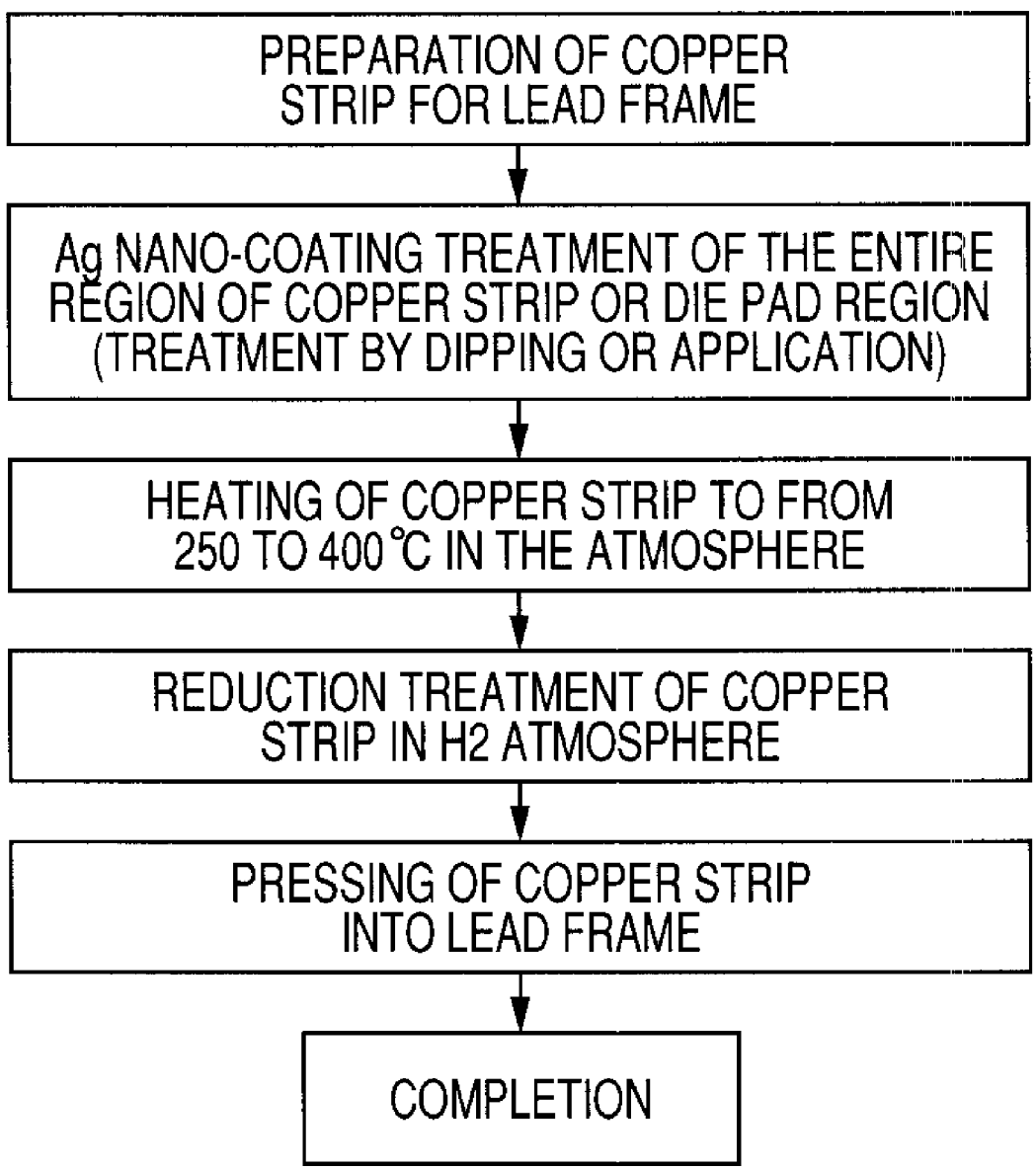
FIG. 9 is a flow chart showing manufacturing steps of a lead frame to be used in Embodiment 1.
Figure 10A:
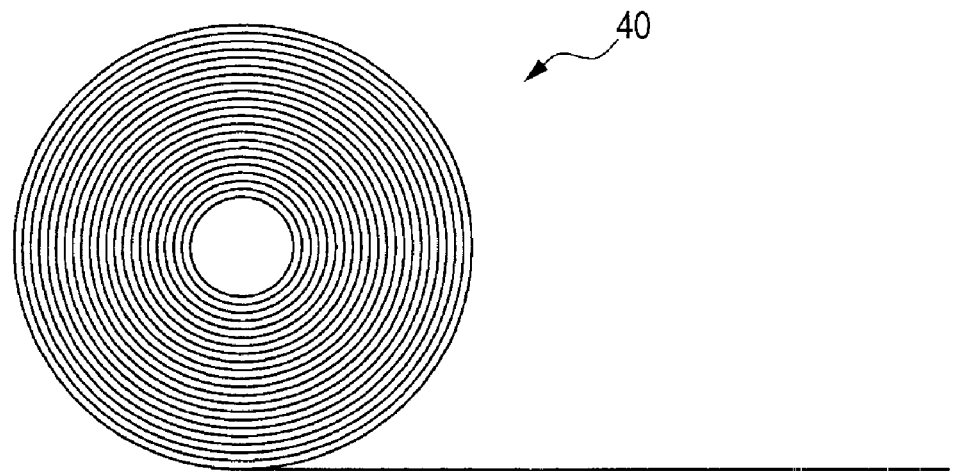
FIG. 10(a) is a side view illustrating a copper strip to be used as a raw material of the lead frame to be used in Embodiment 1 and FIG. 10(b) is a partial plan view of this copper strip.
Figure 10B:
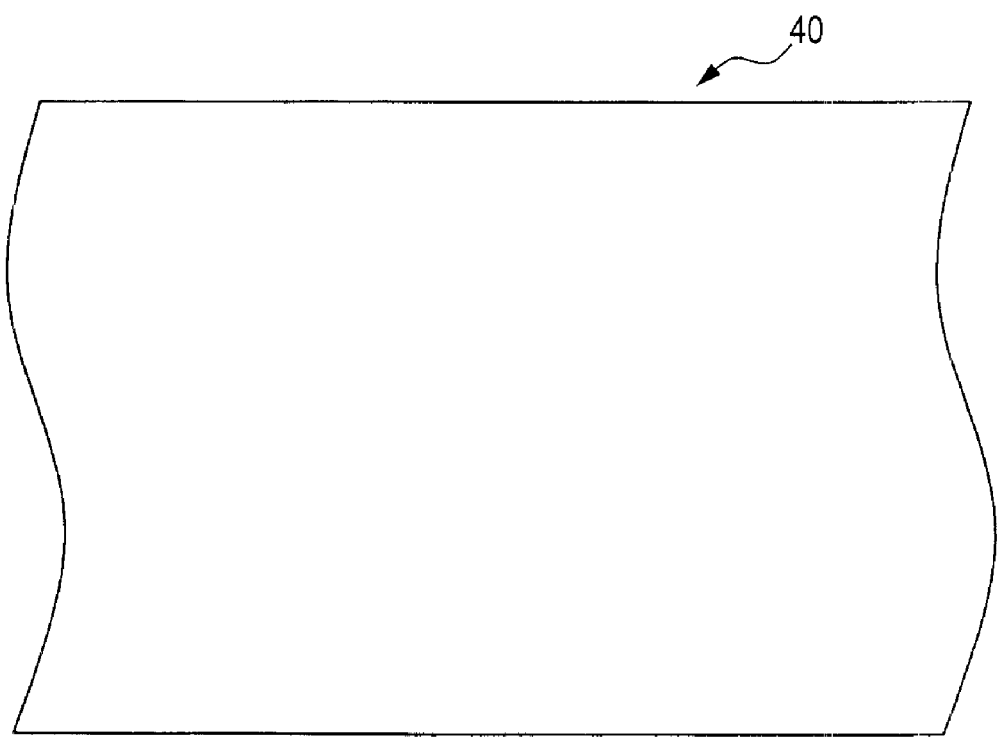

A manufacturing method of SOP8 (semiconductor device 1A) having the above-described structure will next be described. FIG. 9 is a flow chart showing the manufacturing steps of a lead frame comprising the die pad portion 4D and the lead L. When the lead frame is manufactured, a copper strip 40 for lead frame as illustrated in FIGS. 10(a) and 10(b) is prepared first. FIG. 10(a) is an overall view of the coiled copper strip 40 and FIG. 10(b) is a plan view illustrating a portion of it. The copper strip 40 is made of a copper plate or a copper alloy plate having a thickness of, for example, from about 100 µm to 150 µm.

Next, an Ag nanoparticle coated film 9B having a thickness of from about 100 nm to 10 µm is formed over the entire surface of this copper strip 40. Described specifically, a dispersion formed by dispersing Ag nanoparticles in a volatile organic solvent or pure water and then, the resulting dispersion is applied to the entire surface of the copper strip 40 by using a dipping method or a spray coating method. During the application, the viscosity of the dispersion may be controlled by adding an organic resin or the like thereto.

The resulting copper strip 40 is then heated and baked in the atmosphere of from 250 to 400° C. By this heating and baking, the solvent or resin content in the dispersion disappears and coalescence of the Ag nanoparticles starts. At the same time, coalescence of these particles with the surface of the copper strip 40 starts. During this heating/baking step, no positive pressurizing treatment is given so that even if coalescence of Ag nanoparticles proceeds with an increase in the baking temperature or with the passage of time, densification of the Ag nanoparticle coated film 9B does not occur. After baking, the Ag nanoparticle coated film 9B becomes a porous film having, in the surface or inside thereof, a number of minute pores and it forms partially a metal joining on the interface contiguous to the copper strip 40.

Figure 11:
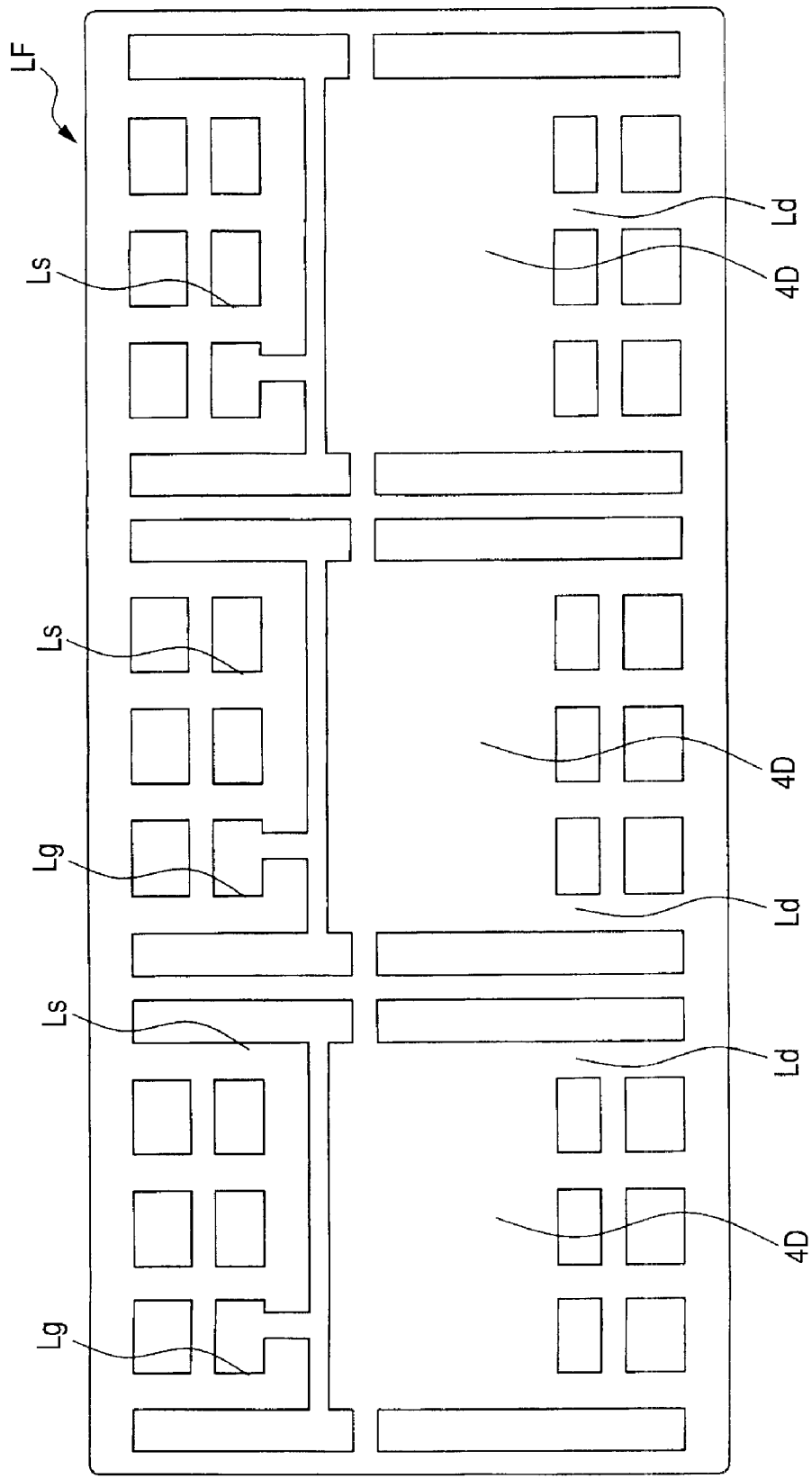
FIG. 11 is a plan view illustrating a completed state of the lead frame.

Then, the copper strip 40 is subjected to reduction treatment in a hydrogen atmosphere to remove an oxide layer formed on the surface of the copper strip 40 in the heating/baking step. Then, the copper strip 40 is pressed into a lead frame LF as illustrated in FIG. 11. Such a method of directly forming the Ag nanoparticle coated film 9B on the surface of the copper strip 40 is also advantageous because a step of plating the surface of the copper strip 40 which is conventionally employed in the manufacturing step of a lead frame can be omitted.

Figure 12:
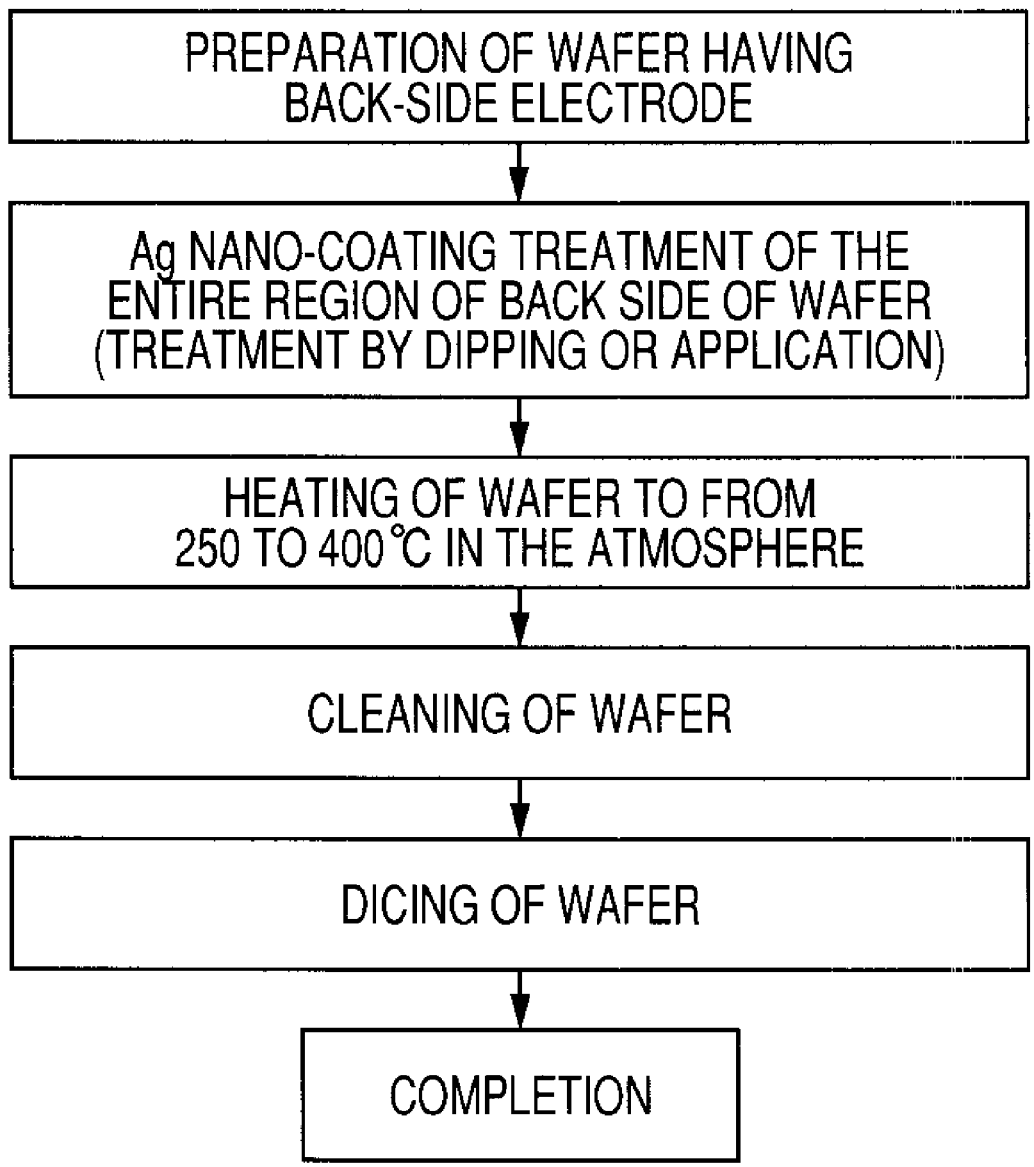
FIG. 12 is a flow chart showing manufacturing steps of the silicon chip to be used in Embodiment 1.
Figure 13A:
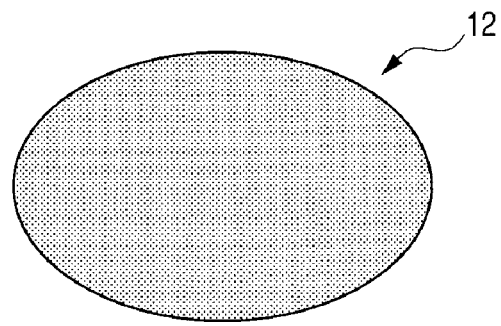
FIGS. 13(a), 13(b), and 13(c) are schematic views showing, in the order of steps, a process of forming an Ag nanoparticle coated film over the back side of a semiconductor wafer.

Concurrently with the manufacture of the lead frame LF, an Ag nanoparticle coated film 9A is formed on the back surface of the silicon chip 3A in accordance with the flow of manufacturing steps shown in FIG. 12. Described specifically, a silicon wafer 12 having, over the back side thereof, a drain electrode 6 is prepared first as illustrated in FIG. 13(a). Over the main surface of this silicon wafer 12, the power MOSFET as illustrated in FIG. 7 is formed and over the back surface of it, a drain electrode 6 is formed by depositing a Ti film, a Ni film, and Au film successively.

Figure 13B:
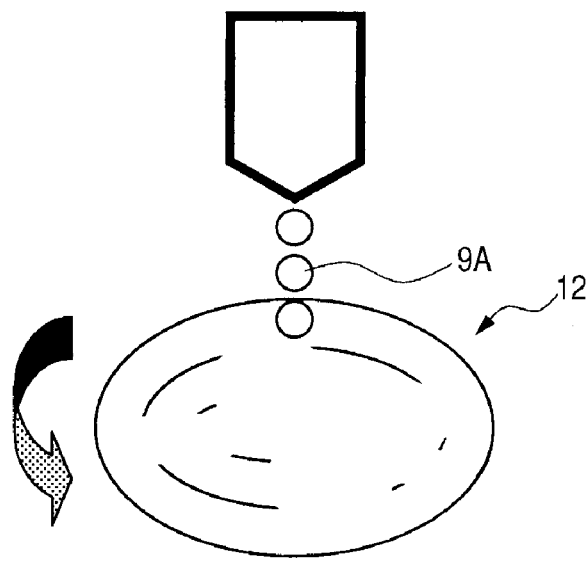

As illustrated in FIG. 13(b), an Ag nanoparticle coated film 9A having a thickness of from about 100 nm to 10 µm is formed over the entire back surface of the silicon wafer 12 by using spin coating or the like. As a raw material for the Ag nanoparticle coated film 9A, the raw material (dispersion) employed for the Ag nanoparticle coated film 9B may be used.

Then, the silicon wafer 12 is heated/baked in the atmosphere of from 250 to 400° C. By this heating/baking, the solvent or resin content in the dispersion disappears and coalescence of the Ag nanoparticles start. At the same time, coalescence of these particles with the surface of the drain electrode 6 starts. During this heating/baking step, no positive pressurizing treatment is given so that even if coalescence of Ag nanoparticles proceeds with an increase in the baking temperature or with the passage of time, densification of the Ag nanoparticle coated film 9A does not occur. After baking, the Ag nanoparticle coated film 9A becomes a porous film having, in the surface or inside thereof, a number of minute pores and it forms partially a metal joining on the interface contiguous to the drain electrode 6.

Figure 13C:
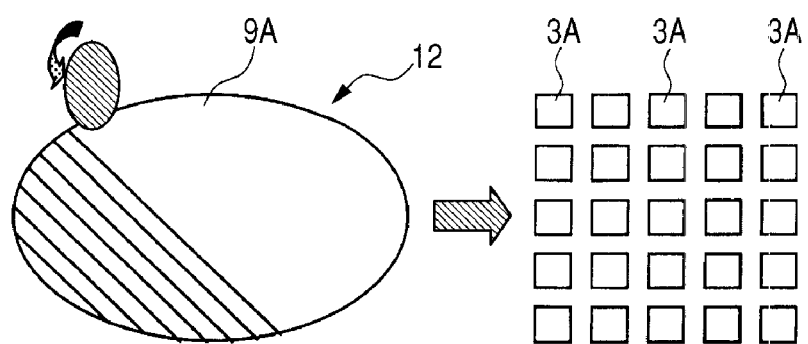

The silicon wafer 12 is then cleaned with a chemical solution or pure water to remove foreign matters such as an oxide layer formed during the heating/baking step. As illustrated in FIG. 13(c), the silicon wafer 12 is diced with a diamond blade or the like into silicon chips 3A each having the Ag nanoparticle coated film 9A formed on the surface of the drain electrode 6.

Figure 14:
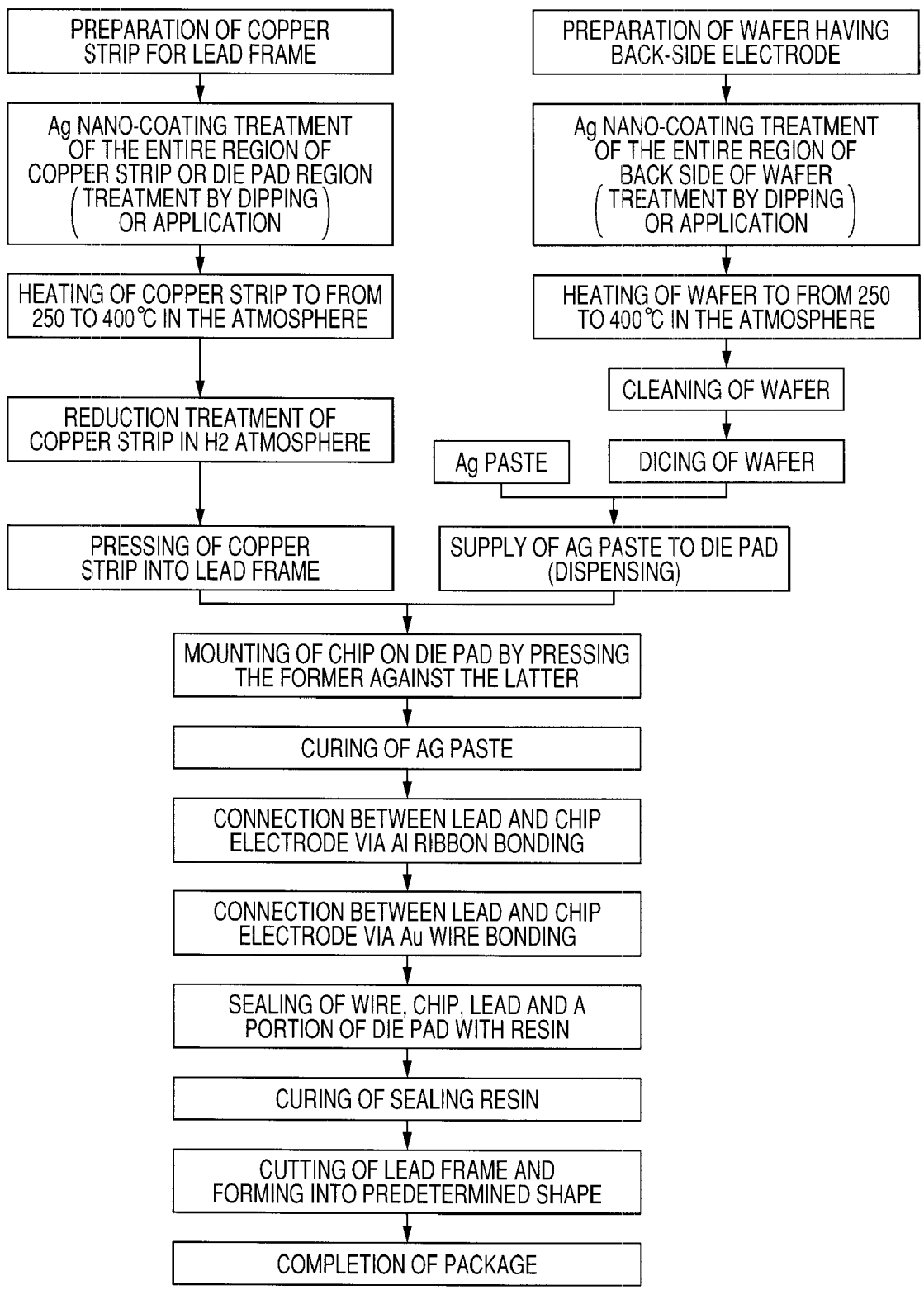
FIG. 14 is a flow chart showing manufacturing steps of the semiconductor device according to Embodiment 1.

FIG. 14 is a flow chart showing the entirety of manufacture steps of SOP8 (semiconductor device 1A) including the flow charts shown in FIG. 9 and FIG. 12.

Figure 15:
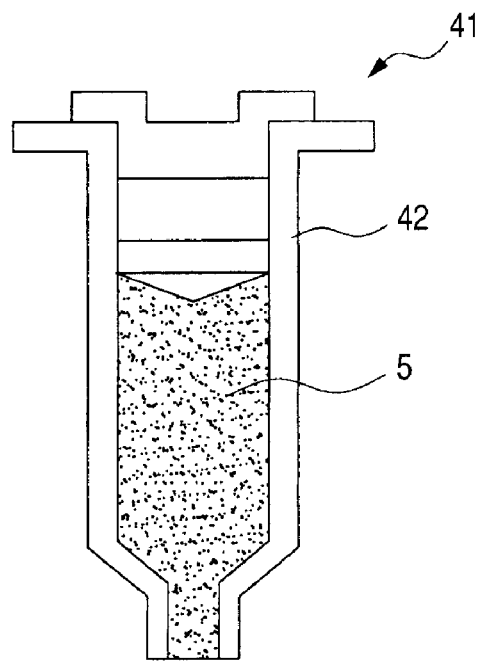
FIG. 15 is a side view of a dispenser to be used in the manufacturing step of the semiconductor device according to Embodiment 1.
Figure 16:
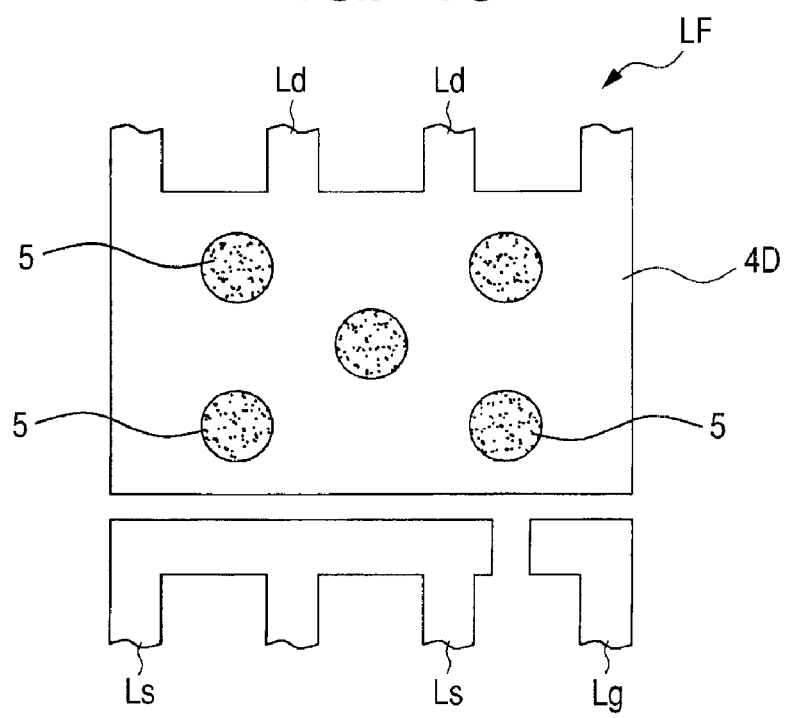
FIG. 16 is a fragmentary plan view of the lead frame showing a manufacturing method of the semiconductor device according to Embodiment 1.
Figure 17:
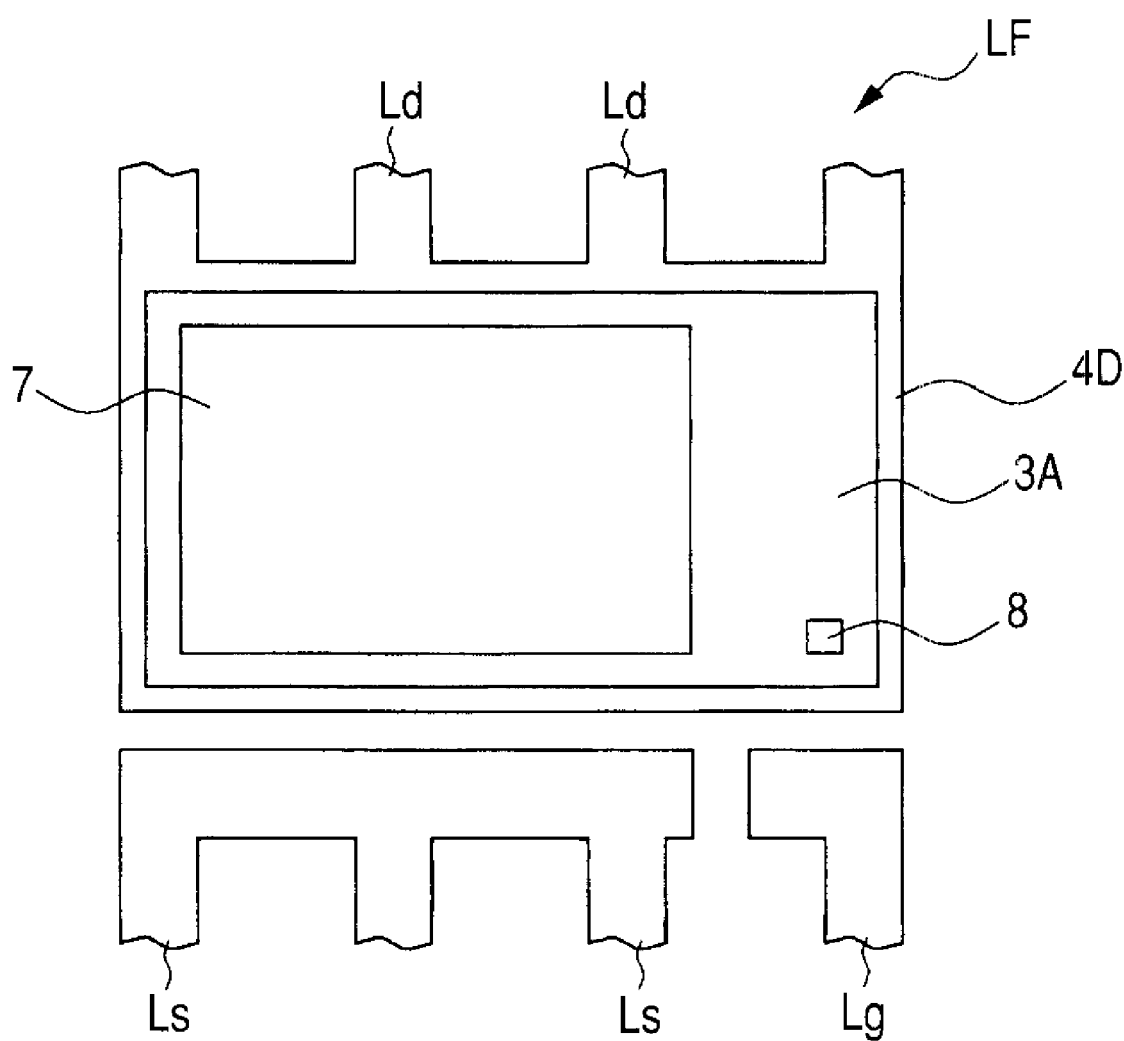
FIG. 17 is another fragmentary plan view of the lead frame showing the manufacturing method of the semiconductor device according to Embodiment 1.

The silicon chip 3A is mounted over the die pad portion 4D of the lead frame LF, which has been manufactured by the above-described process, first by filling the Ag paste 5 in a syringe 42 of a dispenser 41 as illustrated in FIG. 15 and supplying the Ag paste 5 onto the die pad portion 4D of the lead frame LF as illustrated in FIG. 16. Then, as illustrated in FIG. 17, the silicon chip 3A is pressed against the die pad 4D with its main surface up. During this time, a portion of an uncured liquid epoxy resin contained in the Ag paste 5 penetrates into minute pores of the Ag nanoparticle coated films 9A and 9B.

Then, the Ag paste 5 is cured by heating the lead frame LF at about 200° C. By this curing treatment, the epoxy resin in the Ag paste 5 is cured while partially penetrating into the minute pores of the Ag nanoparticle coated films 9A and 9B. A mechanical anchor effect acts on the interface between the Ag nanoparticle coated films 9A and 9B and the Ag paste 5, whereby the silicon chip 3A and the die pad portion 4D adhere tightly via the Ag nanoparticle coated films 9A and 9B and the Ag paste 5. In addition, a metal bond is formed on the interface between the Ag nanoparticle coated film 9A and the drain electrode 6 and the interface between the Ag nanoparticle coated film 9B and the die pad portion 4D, which enhances the adhesion strength of these interfaces and at the same time, reduces electrical resistance.

By a wedge bonding process making use of ultrasonic wave, an Al ribbon 10 is bonded to the source pad 7 of the silicon chip 3A and the source lead Ls.

Figure 18:
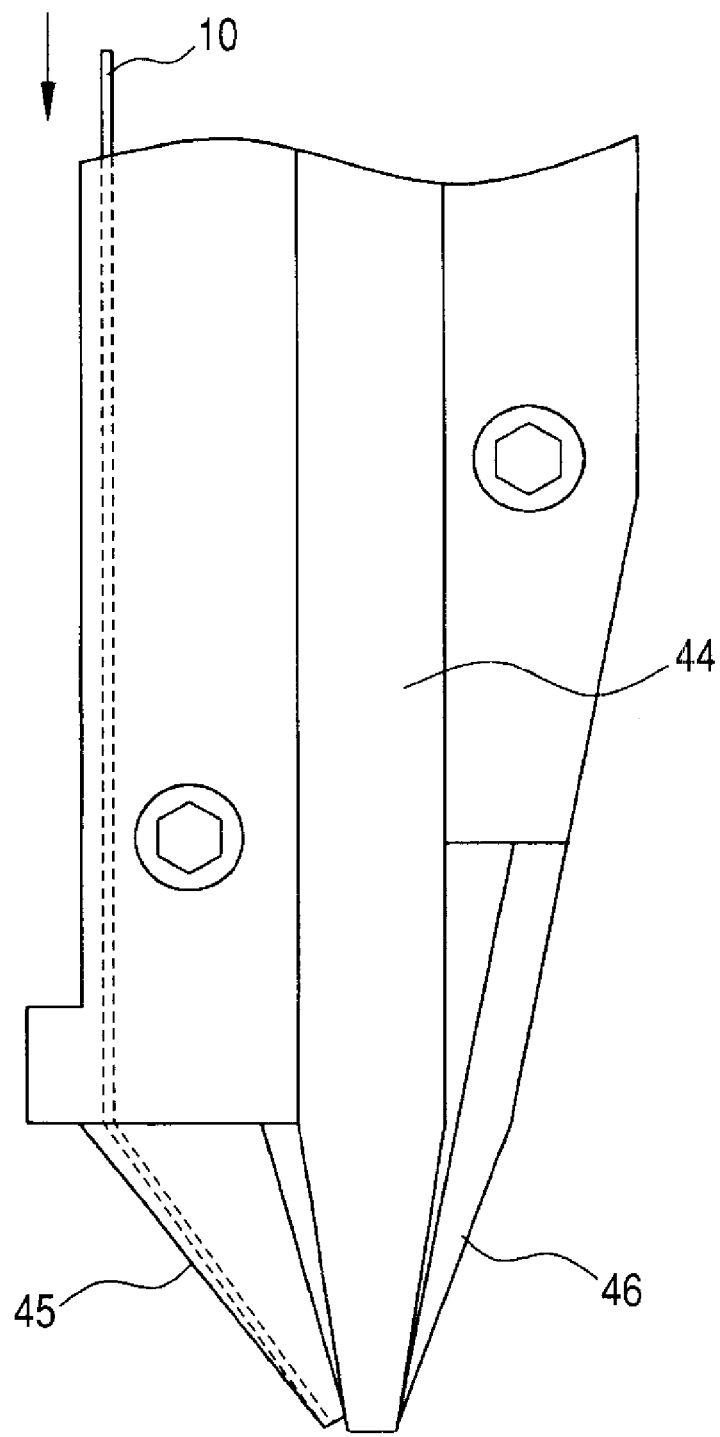
FIG. 18 is a fragmentary side view of a wedge tool to be used in the manufacturing step of the semiconductor device according to Embodiment 1.

FIG. 18 is a side view illustrating a tip portion and the vicinity of a wedge tool to be used for bonding of the Al ribbon 10. As is apparent from this drawing, the wedge tool 44 is equipped, on one side thereof, with a ribbon guide 45 and the Al ribbon 10 which has passed in this ribbon guide 45 is discharged to the tip portion of the wedge tool 44. On the other side surface of the wedge tool 44, a cutter 46 for cutting the Al ribbon 10 discharged to the tip portion of the wedge tool 44 is attached to permit vertical movement.

Figure 19:
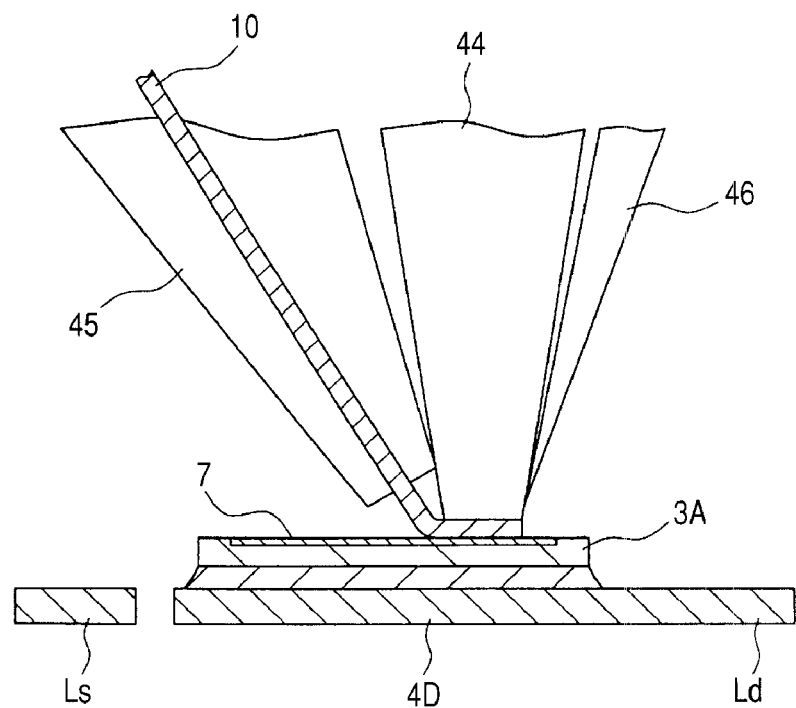
FIG. 19 is a fragmentary cross-sectional view illustrating a bonding step of an Al ribbon according to Embodiment 1.

In order to bond the Al ribbon 10 to the silicon chip 3A and the source lead Ls by using the wedge tool 44, the tip portion of the Al ribbon 10 discharged from the ribbon guide 45 is positioned on the source pad 7 of the silicon chip 3A as illustrated in FIG. 19 and then, the bottom surface of the wedge tool 44 is brought into contact with the Al ribbon 10 under pressure and ultrasonic oscillation is applied thereonto. The Al ribbon 10 in a region contiguous to the bottom surface of the wedge tool 44 is bonded to the surface of the source pad 7.

Figure 20:
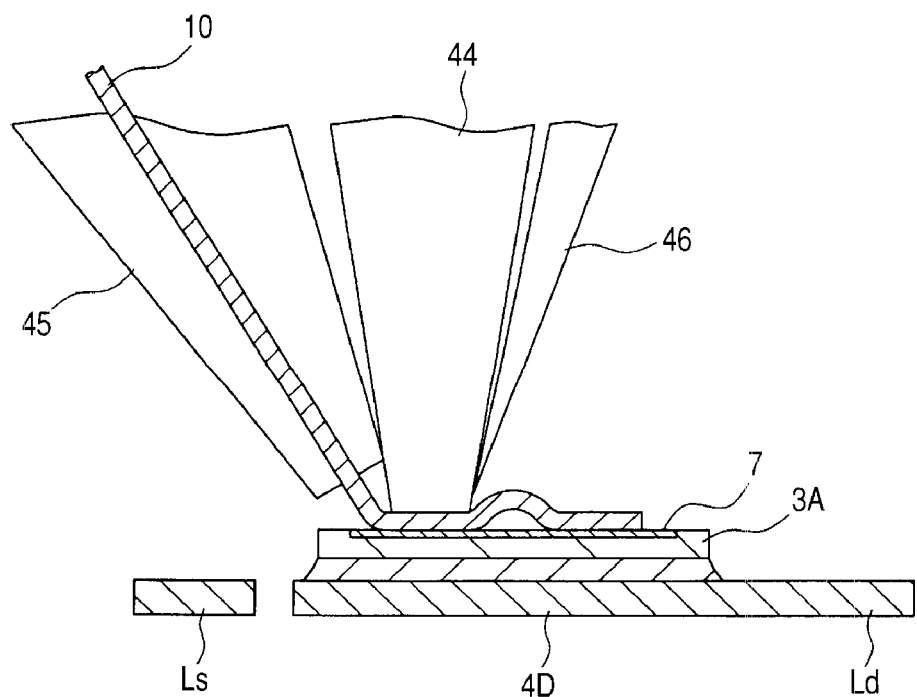
FIG. 20 is another fragmentary cross-sectional view illustrating the bonding step of an Al ribbon according to Embodiment 1.

As illustrated in FIG. 20, after the wedge tool 44 is transferred, the bottom thereof is brought into contact with the Al ribbon 10 under pressure again and ultrasonic oscillation is applied, whereby the Al ribbon 10 in a region contiguous to the bottom surface of the wedge tool 44 is bonded to the surface of the source pad 7. Thus, a coupling area can be secured between the Al ribbon 10 and the source pad 7 by wedge bonding of the Al ribbon 10 to two positions of the source pad 7.

Figure 21:
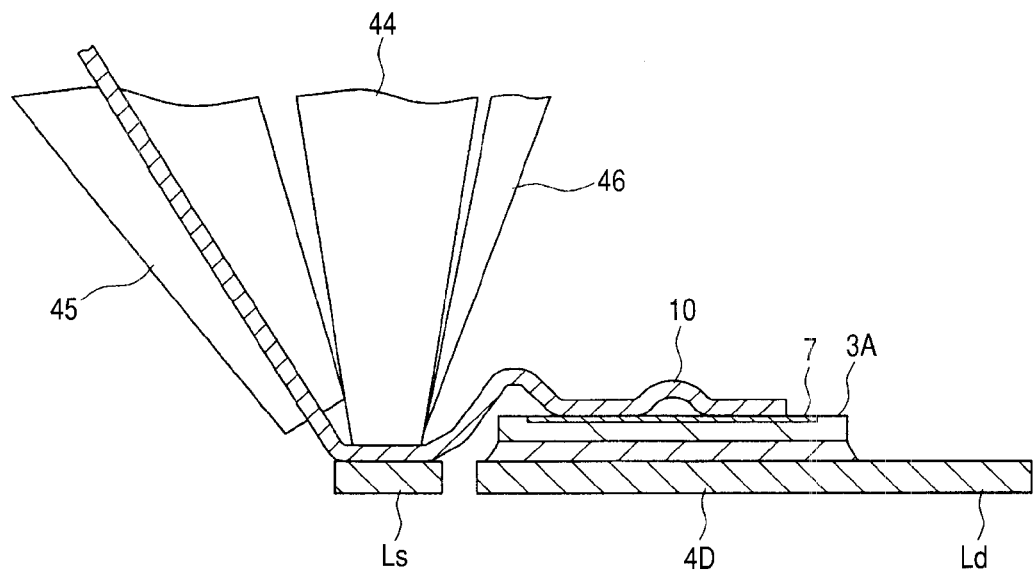
FIG. 21 is another fragmentary cross-sectional view illustrating the bonding step of an AL ribbon according to Embodiment 1.

As illustrated in FIG. 21, the wedge tool 44 is transferred further. After positioning of the center of the bottom surface of the wedge tool to the center of the source lead Ls, the bottom surface of the wedge tool 44 is brought into contact with the Al ribbon 10 under pressure on the source lead Ls and ultrasonic oscillation is applied. Then, the Al ribbon 10 in a region contiguous to the bottom surface of the wedge tool 44 is bonded to the surface of the source lead Ls.

Figure 22:
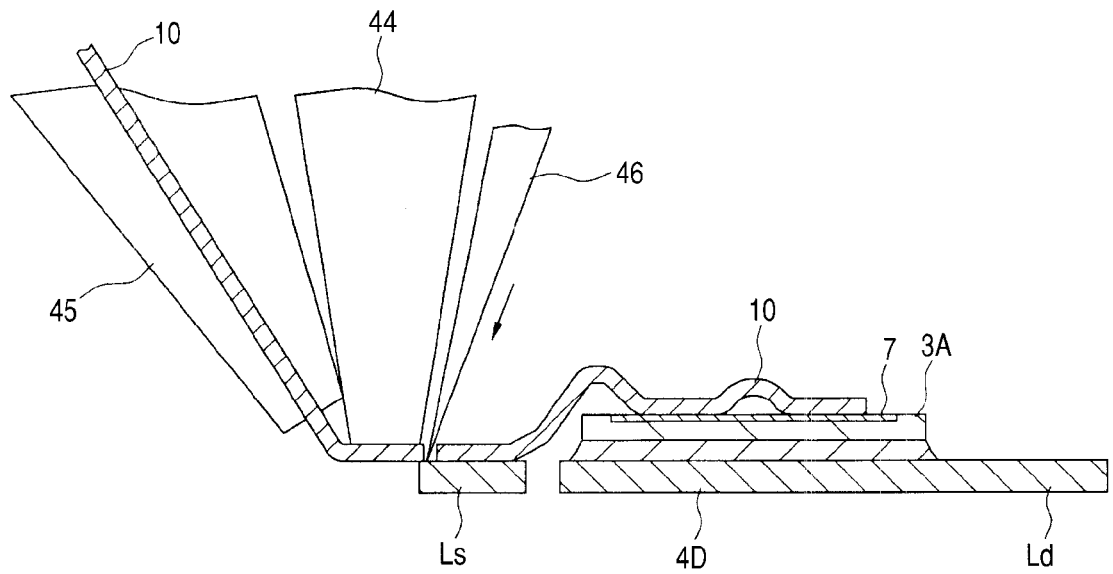
FIG. 22 is another fragmentary cross-sectional view illustrating the bonding step of an Al ribbon according to Embodiment 1.

As illustrated in FIG. 22, the cutter 46 is positioned on the end portion of the source lead Ls and then brought it down. The Al ribbon 10 in a region not bonded to the source lead Ls is cut and coupling of the Al ribbon 10 and the source pad 7 and the source lead Ls is completed.

Figure 23:
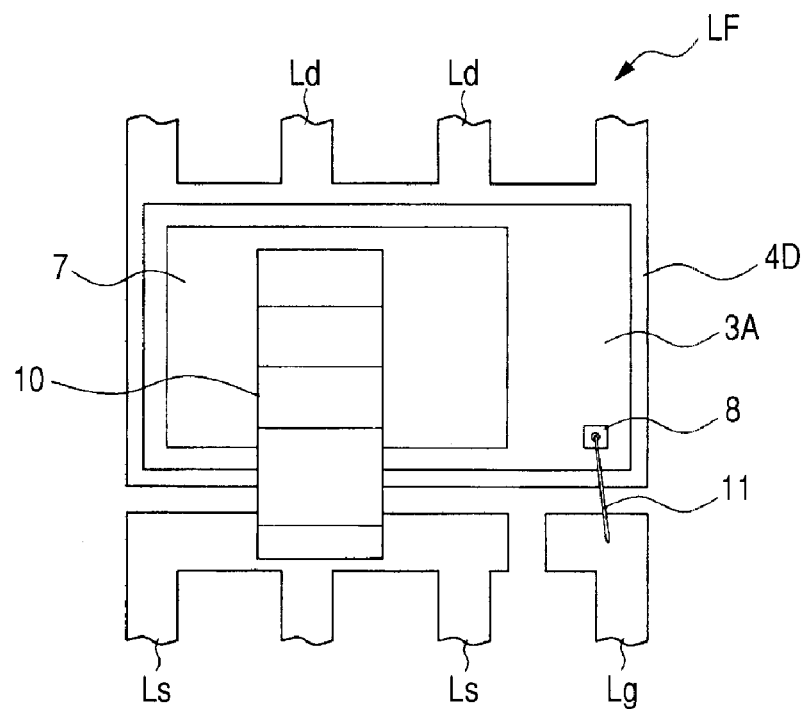
FIG. 23 is a fragmentary plan view of the lead frame illustrating the manufacturing method of the semiconductor device according to Embodiment 1.

After bonding of the Al ribbon 10 to the silicon chip 3A and the source lead Ls as described above, an Au wire 11 is bonded to the gate pad 8 of the silicon chip 3A and the gate lead Lg by a ball bonding process making use of heat and ultrasonic wave as illustrated in FIG. 23.

Figure 24:
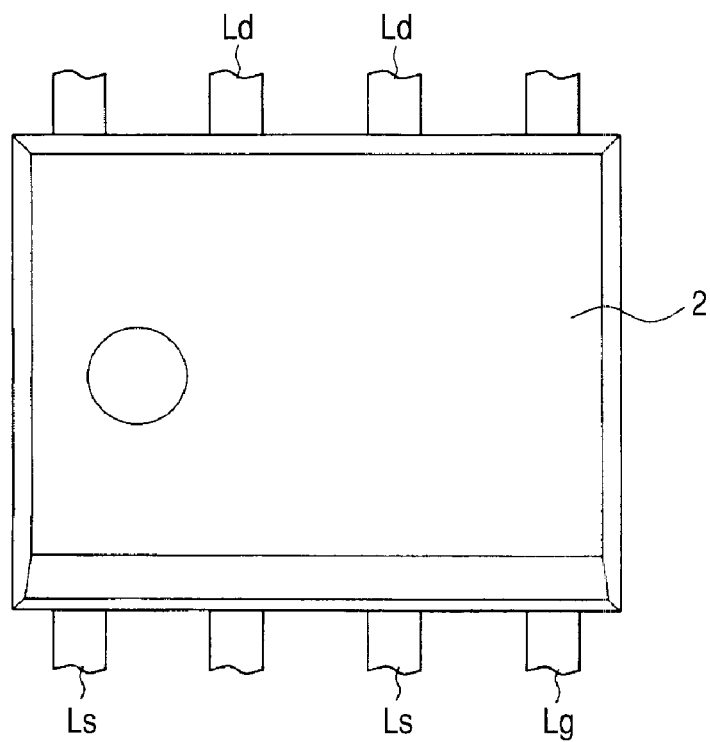
FIG. 24 is another fragmentary plan view of the lead frame illustrating the manufacturing method of the semiconductor device according to Embodiment 1.

Then, by using a molding die, the silicon chip 3A (and the die pad portion 4D, the Al ribbon 10, the Au wire 11, and an inner lead portion of the lead L) is sealed with a molding resin 2 (FIG. 24). In this molding step, a portion of the epoxy resin comprising the molding resin 2 is cured while partially penetrating in the minute pores of the Ag nanoparticle coated film 9B formed on the lead L. A mechanical anchor effect therefore acts on the interface between the Ag nanoparticle coated film 9B and the molding resin 2, whereby the lead L and the molding resin 2 adhere tightly via the Ag nanoparticle coated film 9B.

After cutting and removal of an unnecessary portion of the lead L exposed outside from the molding resin 2, the lead L is shaped into a gull-wing. After a selection step for discriminating defective products from good ones, the SOP (semiconductor device 1A) is completed.

Thus, according to this embodiment, adhesion between the silicon chip 3A and the die pad portion 4D can be enhanced by forming the Ag nanoparticle coated film 9A on the back side of the silicon chip 3A and the Ag nanoparticle coated film 9B on the surface of the die pad portion 4D and the lead L.

In this embodiment, the Ag nanoparticle coated film 9B is formed on the surface of the lead frame LF (the die pad portion 4D and the lead L) and the Ag nanoparticle coated film 9A is formed on the drain electrode 6 on the back side of the silicon chip 3A. In order to simplify the manufacturing steps, the step of forming the Ag nanoparticle coated film 9A on the surface of the drain electrode 6 can be omitted. Although it reduces the adhesion between the silicon chip 3A and the die pad portion 4D a little, adhesion therebetween is stronger compared with that attained by the use of a conventional technique in which the silicon chip 3A and the die pad portion 4D are bonded using only the Ag paste 5. Adhesion between the lead L and the molding resin 2 is also stronger compared with that attained by the use of the conventional technique because strong adhesion can be attained by the use of the Ag nanoparticle coated film 9B.

As the material of the lead frame LF, copper is used. It may however be replaced by, for example, a Fe—Ni alloy. In this case, a similar effect is available by directly forming the Ag nanoparticle coated film 9B on the surface of the Fe—Ni alloy in accordance with the above-described process.

Embodiment 2

Figure 25:
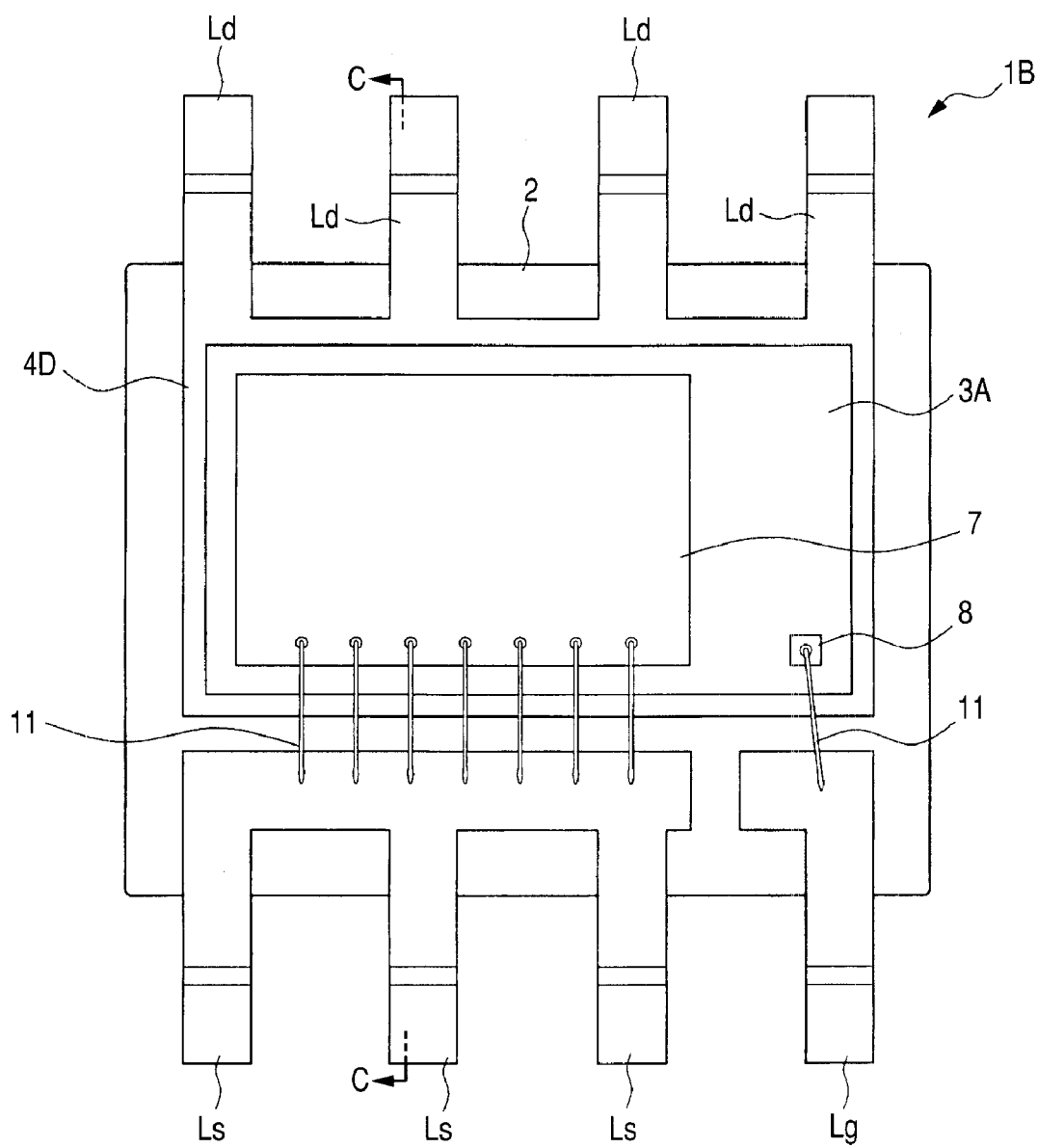
FIG. 25 is a plan view illustrating the internal structure of a semiconductor device according to Embodiment 2 of the invention.
Figure 26:
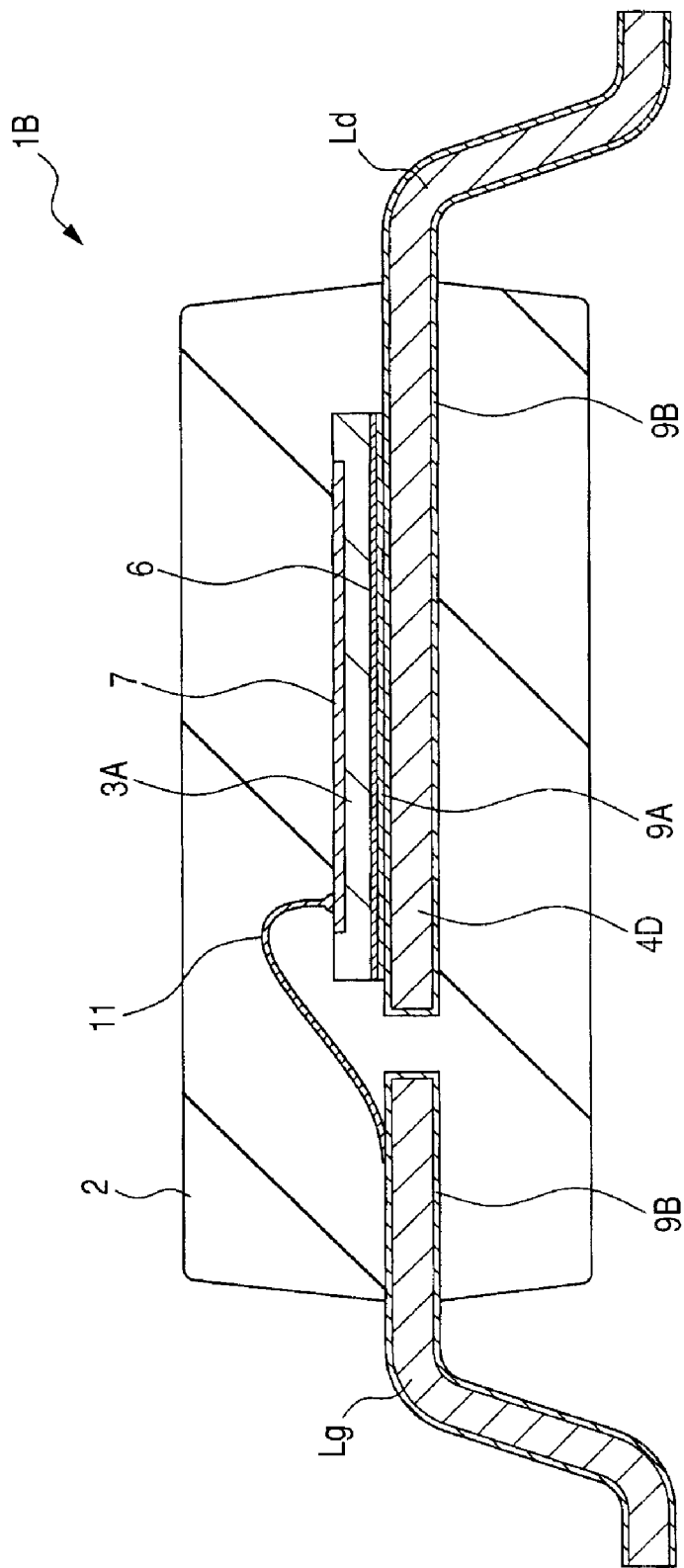
FIG. 26 is a cross-sectional view taken along a line C-C of FIG. 25.

FIG. 25 is a plan view illustrating the internal structure of a semiconductor device according to this embodiment and FIG. 26 is a cross-sectional view taken along a line C-C of FIG. 25.

As in Embodiment 1, a semiconductor device 1B of this embodiment is applied to SOP8. A difference from the SOP8 of this embodiment resides in that a silicon chip 3A and a die pad portion 4D are bonded directly without using an Ag paste 5. In addition, a lead L and a source pad 7 are electrically coupled to each other not via an Al ribbon 10 but via a plurality of Au wires 11.

Described specifically, the silicon chip 3A is mounted, with the main surface up, over the die pad portion 4D integrally formed with a drain lead Ld. The silicon chip 3A has, on the back side thereof, a drain electrode 6 coupled to the drain of a power MOSFET and on the surface of this drain electrode 6, an Ag nanoparticle coated film 9A is formed. The die pad 4D and eight leads L are made of copper or a copper alloy and on the surface thereof, an Ag nanoparticle coated film 9B is formed. The back surface (drain electrode 6) of the silicon chip 3A and the die pad portion 4D are bonded to each other via two layers of the Ag nanoparticle coated films 9A and 9B.

Over the main surface of the silicon chip 3A, a source pad (source electrode) 7 and a gate pad 8 are formed. The source pad 7 and the gate pad 8 are comprised of an Al alloy film formed as the uppermost layer of the silicon chip 3A. The source pad 7 has a wider area than the gate pad 8 in order to reduce the on-resistance of the power MOSFET. Because of a similar reason, the entire back surface of the silicon chip 3A comprises the drain electrode 6 of the power MOSFET.

In the semiconductor device 1B of this embodiment, three source leads Ls (from No. 1 lead to No. 3 lead) are linked to each other inside the molding resin 2. A linked portion is electrically coupled to the source pad 7 via a plurality of Au wires 11. On the other hand, a gate lead Lg and the gate pad 8 are electrically coupled to each other via an Au wire 11.

Figure 27:
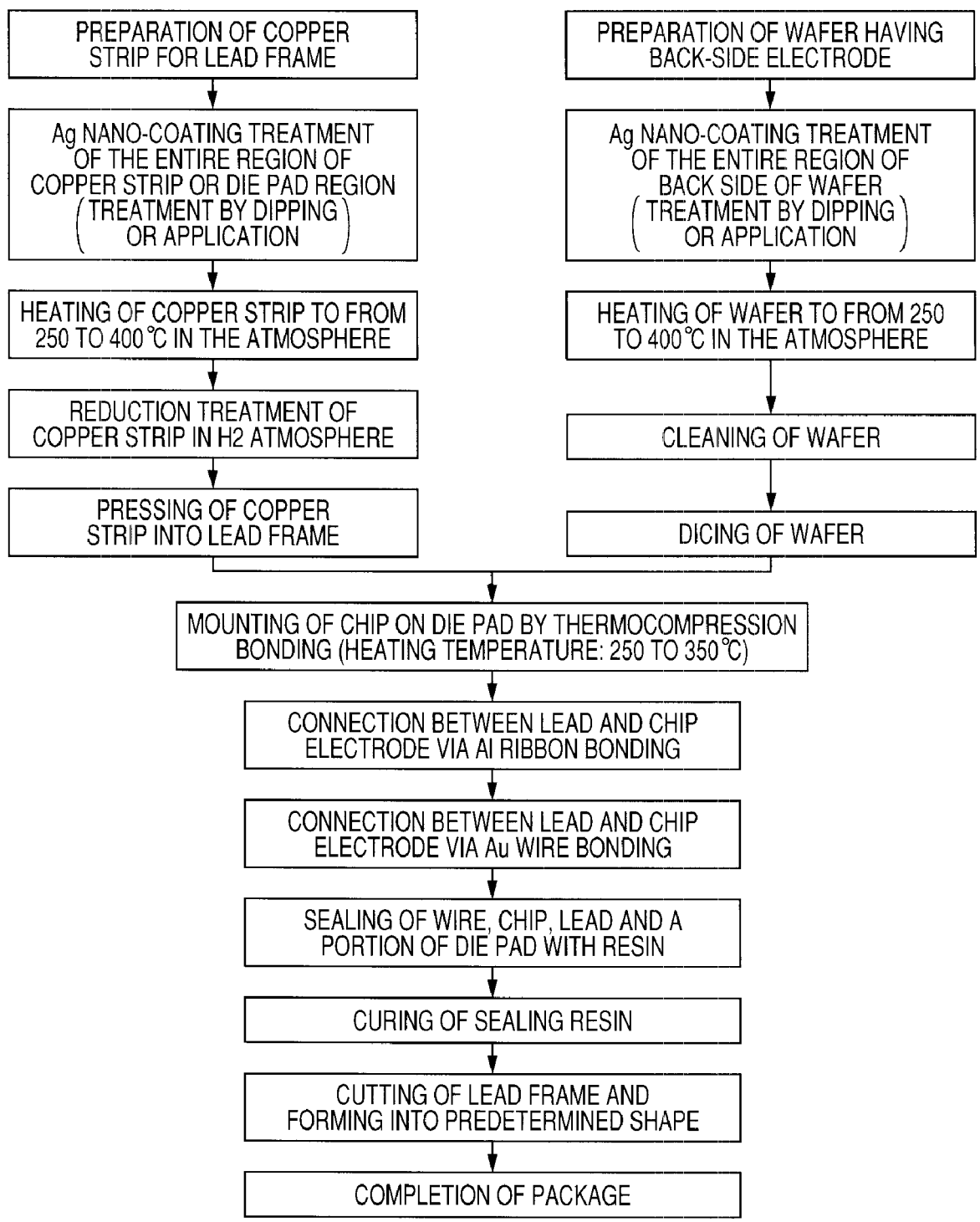
FIG. 27 is a flow chart showing manufacturing steps of the semiconductor device according to Embodiment 2.

A manufacturing method of the SOP 8 (semiconductor device 1B) having such a configuration will next be described in accordance with the flow chart of manufacturing steps shown in FIG. 27.

First, an Ag nanoparticle coated film 9B is formed on the surface of a lead frame LF in a similar manner to that employed in Embodiment 1 and an Ag nanoparticle coated film 9A is formed on the back surface (drain electrode 6) of the silicon chip 3A. These steps are similar to those described in Embodiment 1.

Figure 28:
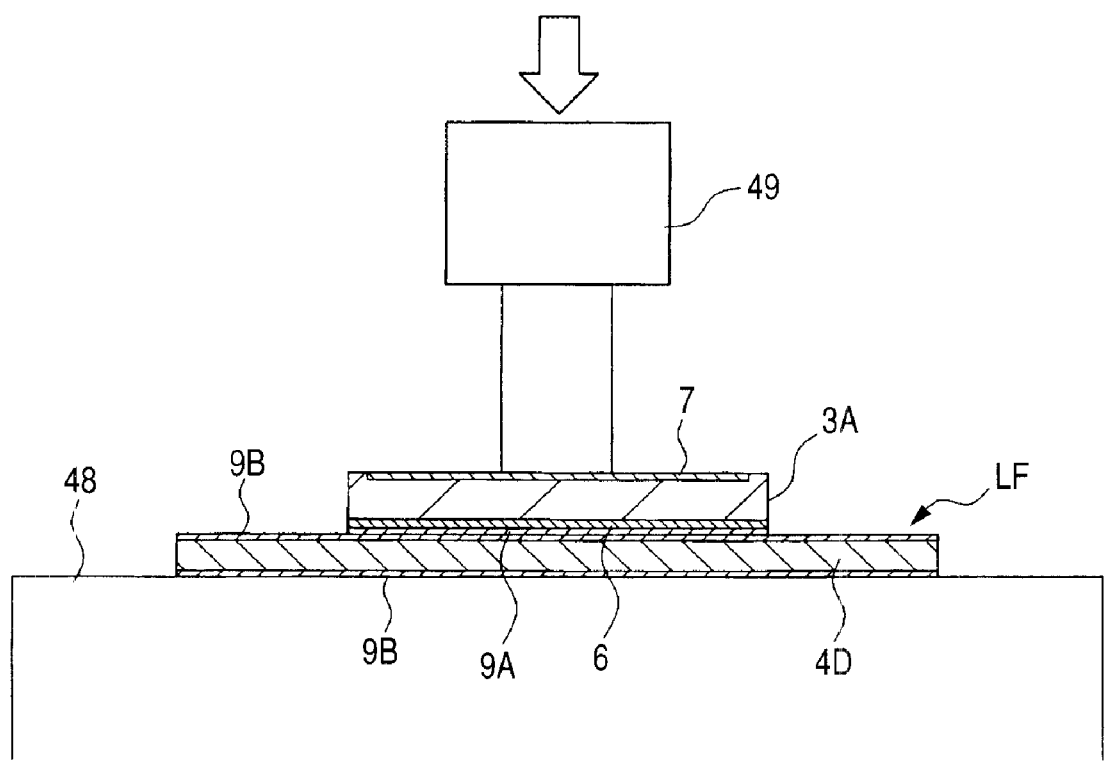
FIG. 28 is a schematic cross-sectional view illustrating a bonding method of a semiconductor chip according to Embodiment 2.

Then, as illustrated in FIG. 28, the lead frame LF is mounted on a die bonding stage 48 equipped with a heating mechanism (not illustrated) and is heated at from 250 to 350° C. After the silicon chip 3A is mounted, with the main surface up, on the die pad portion 4D while being adsorbed and supported by a bonding collet 49, the silicon chip 3A is pressed against the die pad portion 4D by this bonding collet 49.

By thermocompression bonding of the silicon chip 3A onto the die pad portion 4D, the Ag nanoparticle coated films 9A and 9B, which are porous with a number of minute pores in the surface or inside thereof, penetrate into each other. A mechanical anchor effect appears at the interface between them, whereby the silicon chip 3A and the die pad portion 4D adhere tightly via the Ag nanoparticle coated films 9A and 9B. In addition, a metal bond is formed on the interface between the Ag nanoparticle coated film 9A and the drain electrode 6 and the interface between the Ag nanoparticle coated film 9B and the die pad portion 4D, which enhances the adhesion strength of their interfaces and at the same time, reduces electrical resistance.

Then, the source pad 7 of the silicon chip 3A and a source lead Ls and the gate pad 8 and a gate lead Lg are bonded to each other via an Au wire 11 by using a ball bonding process utilizing heat and ultrasonic wave. The reason why the Au wire 11 is used instead of the Al ribbon 10 for coupling between the source pad 7 and the source lead Ls is to reduce damage on the bonded surface between the back surface (drain electrode 6) of the silicon chip 3A and the die pad portion 4D. Ultrasonic oscillation energy applied to the surface of the source pad 7 during bonding via the Al ribbon 10 is by far greater than ultrasonic oscillation energy applied onto the surface of the source pad 7 during bonding via the Al wire 11. In this embodiment in which bonding is performed without using the Ag paste 5, the back surface (drain electrode 6) of the silicon chip 3A adheres tightly to the die pad portion 4D via thin Ag nanoparticle coated films 9A and 9B. Coupling of the source pad 7 and the source lead Ls via the Al ribbon 10 reduces adhesion therebetween due to great damage on the bond surface of the Ag nanoparticle coated films 9A and 9B.

Then, by using a molding die, the silicon chip 3A (and the die pad portion 4D, the Au wire 11, and an inner lead portion of the lead L) is sealed with a molding resin 2. In this molding step, a portion of an epoxy resin comprising the molding resin 2 is cured while partially penetrating into minute pores of the Ag nanoparticle coated film 9B formed on the surface of the lead L. A mechanical anchor effect therefore acts on the interface between the Ag nanoparticle coated film 9B and the molding resin 2, whereby the lead L and the molding resin 2 adhere tightly via the Ag nanoparticle coated film 9B.

After cutting and removal of an unnecessary portion of the lead L exposed outside from the molding resin 2, the lead L is shaped into a gull-wing. After a selection step for discriminating defective products from good ones, the semiconductor device 1B is completed.

The manufacturing method of this embodiment enables simplification of manufacturing steps because a step of supplying an Ag paste 5 onto the die pad portion 4D becomes unnecessary.

In this embodiment, the Ag nanoparticle coated film 9B is formed on the surface of the lead frame LF (the die pad portion 4D and the lead L) and the Ag nanoparticle coated film 9A is formed on the drain electrode 6 over the back side of the silicon chip 3A. In order to simplify the manufacturing steps further, either the step of forming the Ag nanoparticle coated film 9A on the surface of the drain electrode 6 or the step of forming the Ag nanoparticle coated film 9B on the surface of the lead frame LF may be omitted.

Embodiment 3

Figure 29:
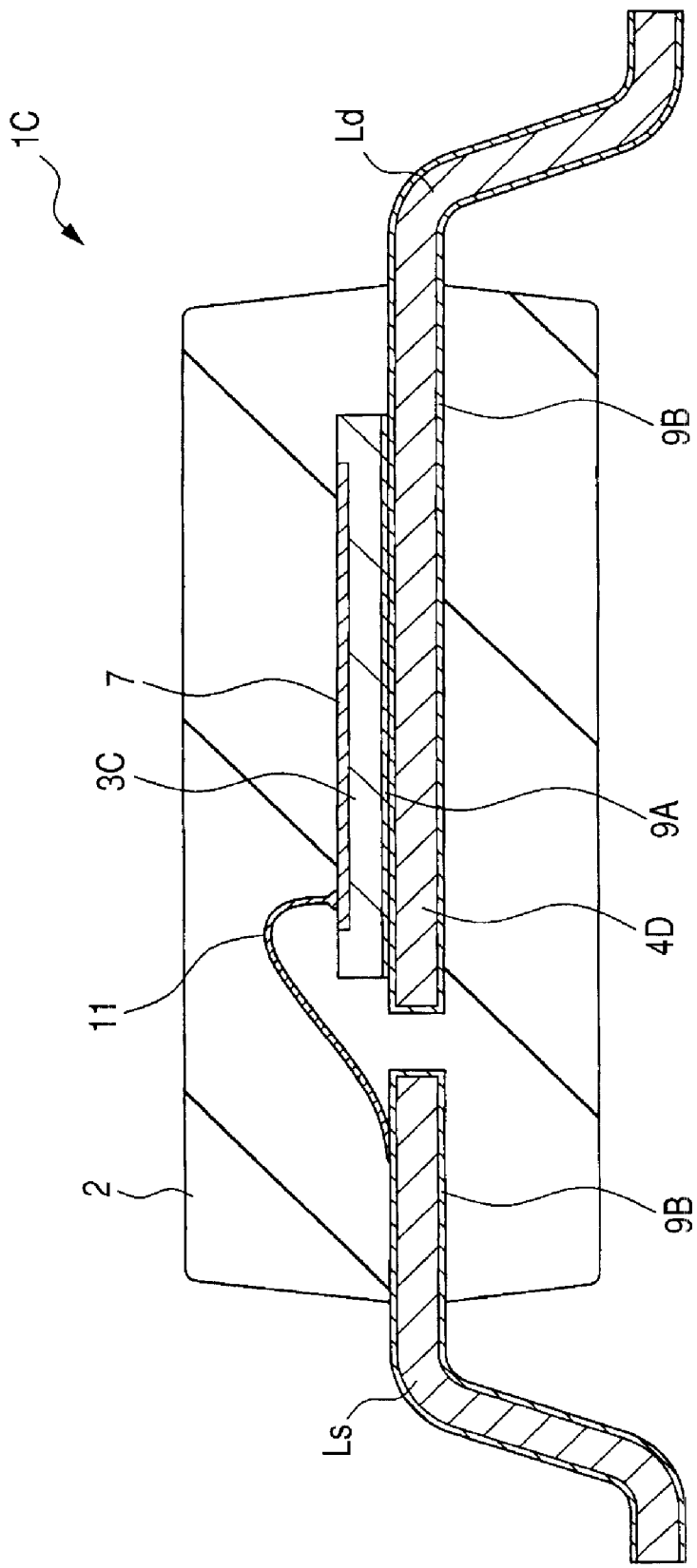
FIG. 29 is a cross-sectional view illustrating a semiconductor device according to Embodiment 3 of the invention.

FIG. 29 is a cross-sectional view illustrating a semiconductor device according to this embodiment. A semiconductor device 1C of this embodiment is formed by mounting, over the die pad portion 4D, a silicon chip 3C having no drain electrode on the back side thereof. It is characterized by that the silicon chip 3C and the die pad portion 4D are directly bonded to each other without using a solder material or the Ag paste 5. A difference from the semiconductor device 1A of Embodiment 1 resides in that the size of the silicon chip 3C is larger than that of the silicon chip 3A of Embodiment 1. Described specifically, the silicon chip 3A of Embodiment 1 has a long side less than 4 mm, while the silicon chip 3C of Embodiment 3 has a long side exceeding 4 mm. With an increase in the chip size, the power MOSFET has a greater capacity compared with that of the semiconductor device 1A of Embodiment 1.

In the power semiconductor device using a silicon chip having, on the back side thereof, no drain electrode, the silicon chip is mounted over the die pad portion by forming an Au—Si eutectic alloy layer over the die pad portion of an Au-plated lead frame. The eutectic point of the Au—Si eutectic alloy is 363° C. and a bonding temperature of about from 410 to 470° C. becomes necessary in consideration of mass production. Such a high temperature causes serious damage to a power device. In addition, the Au—Si eutectic alloy layer has very high hardness as is apparent from the fact that it is called "hard solder" so that use of it for bonding of a silicon chip having a large size is considered to be difficult in view of a difference in thermal expansion coefficient between the silicon chip and the die pad portion.

In Embodiment 3, similar to Embodiment 2, the silicon chip 3C is mounted over the die pad portion 4D by using Ag nanoparticle coated films 9A and 9B. Described specifically, the Ag nanoparticle coated film 9A is formed on the back surface of the silicon chip 3C in the above-described manner and the Ag nanoparticle coated film 9B is formed on the entire surface of the lead frame LF in the above-described manner. As illustrated above in FIG. 28, after mounting the lead frame LF over a die bonding stage 48 and heating it at from 250 to 350° C., the silicon chip 3C is mounted, with the main surface up, over the die pad portion 4D while being adsorbed and supported by a bonding collet 49. The silicon chip 3C is then pressed against the die pad portion 4D by this bonding collet 49. The load at this time is, for example, from 50 to 80 g and pressing time is from 5 msec to 20 msec. It is desired to heat the lead frame LF in an inert gas atmosphere such as nitrogen to prevent oxidation of the surface thereof.

According to the manufacturing method of this embodiment, the silicon chip 3C can be die-bonded at a temperature lower than the eutectic point (363° C.) of the Au—Si eutectic alloy layer so that thermal damage to the power MOSFET formed over the silicon chip 3C can be reduced. In addition, since the Ag nanoparticle coated films 9A and 9B have lower elasticity than the Au—Si eutectic alloy layer, bonding reliability between the silicon chip 3C and the die pad portion 4D can be secured even if they are applied to the die bonding of the silicon chip 3C having a greater size.

Also in this embodiment, in order to simplify the manufacturing steps further, either one of the step of forming the Ag nanoparticle coated film 9A over the back side of the silicon chip 3C or the step of forming the Ag nanoparticle coated film 9B on the surface of the lead frame LF may be omitted.

Embodiment 4

Figure 30:
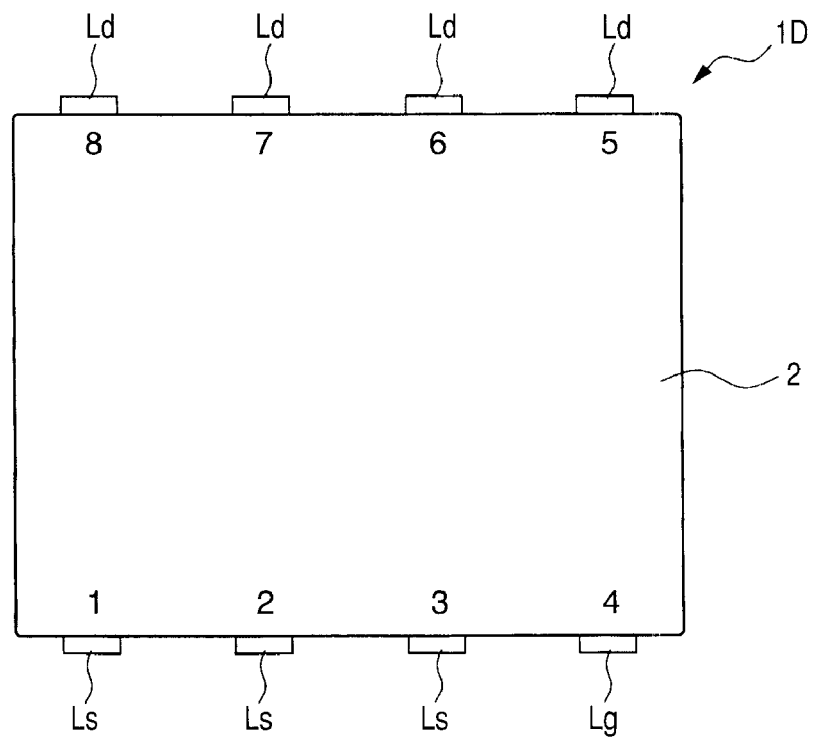
FIG. 30 is a plan view illustrating the appearance on the surface side of a semiconductor device according to Embodiment 4 of the invention.
Figure 31:
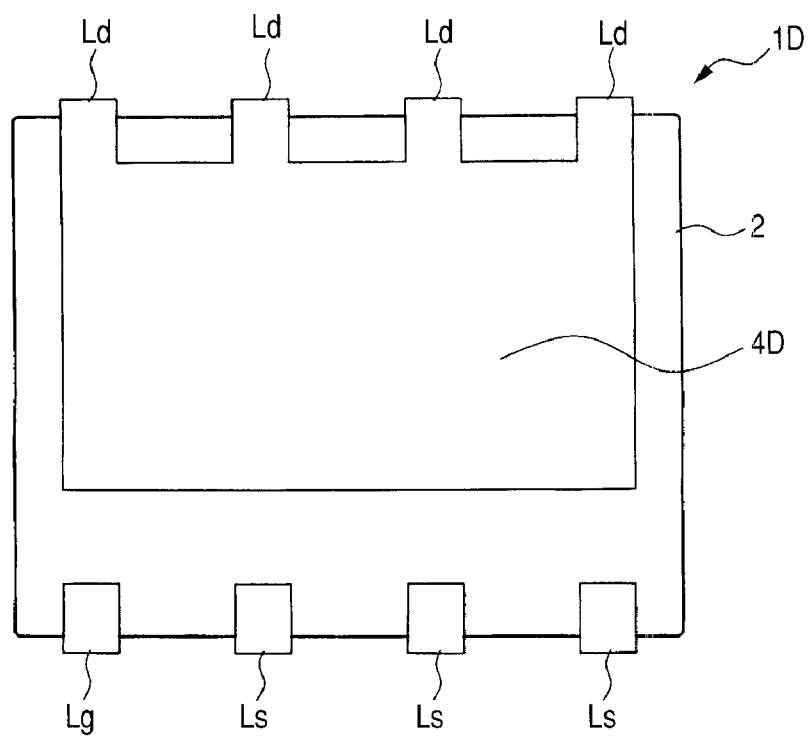
FIG. 31 is a plan view illustrating the appearance on the back side of the semiconductor device according to Embodiment 4 of the invention.
Figure 32:
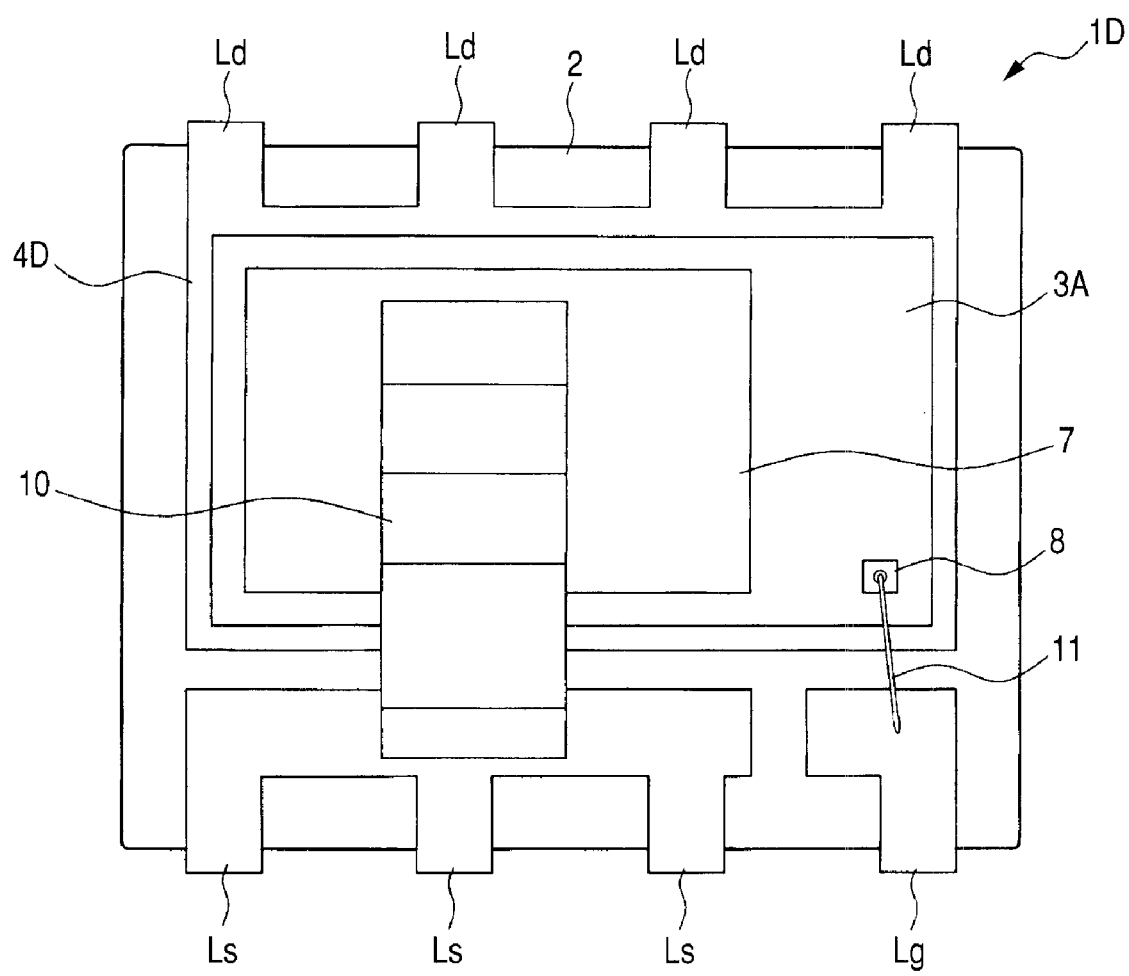
FIG. 32 is a plan view illustrating the internal structure of the semiconductor device according to Embodiment 4 of the invention.

FIGS. 30 to 32 illustrate a semiconductor device according to Embodiment 4, in which FIG. 30 is a plan view illustrating the appearance on the surface side; FIG. 31 is a plan view illustrating the appearance on the back side; and FIG. 32 is a plan view illustrating the internal structure.

A semiconductor device 1D of this embodiment is applied to HWSON8 which is one of small surface mount packages. From the bottom surface of a molding resin 2 comprised of an epoxy resin, outer lead portions of eight leads L comprising external connection terminals of HWSON8 are exposed. Of the leads L illustrated in FIG. 30, No. 1 lead to No. 3 lead are source leads Ls, No. 4 lead is a gate lead Lg, and No. 5 lead to No. 8 lead are drain leads Ld.

Inside the molding resin 2, a silicon chip 3A having thereover a power MOSFET similar to that of Embodiment 1 is sealed. The silicon chip 3A is mounted, with the main surface up, over a die pad portion 4D integrally formed with four drain leads Ld (No. 5 lead to No. 8 lead). The back surface of the die pad portion 4D is exposed from the bottom surface of the molding resin 2 similar to the outer lead portions of eight leads L. The die pad portion 4D and eight leads L (No. 1 lead to No. 8 lead) are comprised of copper or a Fe—Ni alloy and they have, on the surface thereof, a two-layer plating layer (not illustrated) formed by stacking an Ni film and an Au film.

Similar to Embodiment 1, over the main surface of the silicon chip 3A, a source pad (source electrode) 7 and a gate pad 8 are formed. Three source leads Ls (No. 1 lead to No. 3 lead) are coupled to each other inside of the molding resin 2. The coupled portion and the source pad 7 are electrically coupled to each other via an Al ribbon 10. The gate lead Lg (No. 4 lead) and the gate pad 8 are electrically coupled to each other via an Au wire 11.

The drain electrode 6 of the silicon chip 3A and the die pad portion 4D are bonded to each other via an Ag paste 14 interposed therebetween. The configuration of this Ag paste 14 will be described later.

When as in the silicon chip 3A, the source lead Ls and the source pad 7 are bonded to each other via the Al ribbon 10, great ultrasonic oscillation energy is applied to the surface of the source pad 7 during bonding using the Al ribbon 10. This ultrasonic oscillation energy (from about 5 W to 10 W) is by far greater than the ultrasonic oscillation energy applied during bonding using the Au wire 11 so that it causes damage to the Ag paste interposed between the drain electrode 6 and the die pad portion 4D. As a result, it reduces a bonding strength between the silicon chip 3A and the die pad portion 4D and sometimes causes cracks in the Ag paste, leading to separation of the silicon chip 3A from the die pad portion 4D.

The present inventors therefore investigated the physical properties of an Ag paste. As a result, it has been found that for realizing an Ag paste resistant to great ultrasonic oscillation energy to be applied during bonding using an Al ribbon, reduction of a modulus of elasticity of a resin contained in the Ag paste and optimization of a shearing strength of a conductive resin will be important factors.

An Ag paste conventionally used for die bonding of a silicon chip is typically comprised of a conductive resin formed by mixing an Ag filler in a thermosetting epoxy resin. An Ag paste which does not deteriorate easily even by ultrasonic oscillation energy applied thereto during bonding using an Al ribbon can be formed by using, instead of the thermosetting resin to be used for the Ag paste, a mixture of a thermosetting resin and a thermoplastic resin having a low modulus of elasticity.

The thermoplastic resin however has lower heat resistance than the thermosetting resin. Heating of the Ag paste containing the thermoplastic resin at high temperatures causes a reduction in bulk strength of the resin. As a result, cracks appear in the Ag paste, causing a reduction in electrical conductivity or reliability. Particularly in the case of a package in which the die pad portion 4D having a wide area is exposed from the bottom surface of the molding resin 2 as in the semiconductor device 1D (HWSON8) of this embodiment, high heat around 260° C. is applied to the die pad portion 4D in a solder reflow step for mounting the package over a wiring board. Use of the Ag paste containing the thermoplastic resin therefore is likely to reduce the bulk strength of the resin.

The Ag paste 14 used in this embodiment is developed to overcome the above-described problem and it is characterized in that in an ordinarily used Ag paste formed by mixing an Ag filler in a thermosetting resin (for example, a thermosetting epoxy resin) serving as a base resin, a spacer resin comprised of a second thermosetting resin having a particle size of from 8 µm to 20 µm, more preferably from 8 µm to 10 µm is mixed. When the spacer resin has a particle size less than 8 µm, it is difficult to secure a sufficient Ag paste thickness resistant to ultrasonic oscillation energy during bonding using an Al ribbon. On the other hand, when the spacer resin has a particle size exceeding 20 µm, the film thickness of the Ag paste becomes too large, leading to generation of voids in the Ag paste and reduction in the adhesion strength. The modulus of elasticity of the spacer resin is desirably adjusted to 4 GPa or less.

Figure 33:
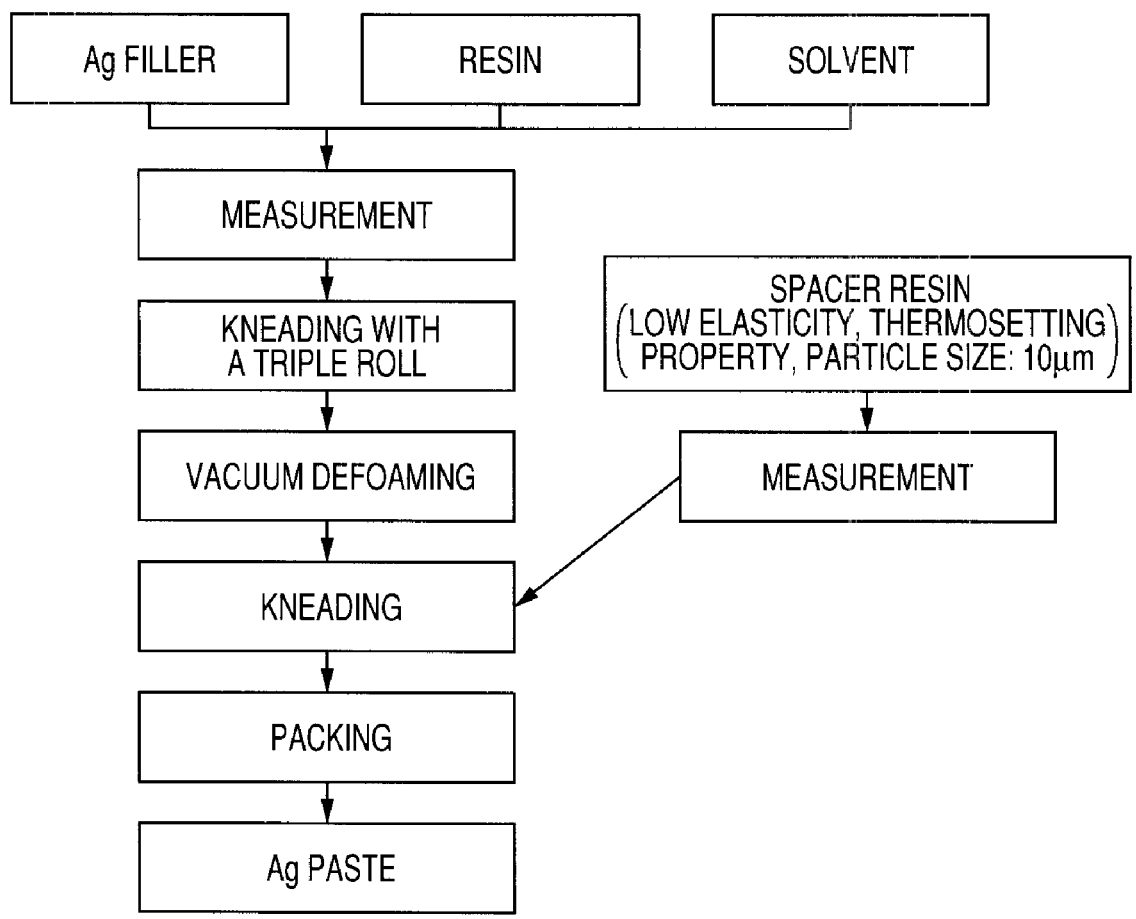
FIG. 33 is a flow chart showing preparation steps of an Ag paste to be used in Embodiment 4.

FIG. 33 is a flow chart of the manufacturing steps of the Ag paste 14 containing the spacer resin. The Ag paste 14 is prepared in the following manner. First, a solvent is added to an Ag filler and a thermosetting resin (for example, a thermosetting epoxy resin) ordinarily used for an Ag paste to control their viscosities, followed by kneading in a roll. After removal of air bubbles inside of the kneaded mass by vacuum defoaming, a spacer resin comprised of a second thermosetting resin (for example, a thermosetting epoxy resin) having a particle size of, for example, about 10 µm is added to the residue, followed by further kneading. When the spacer resin is kneaded, not a roll but, for example, a mixer is used for kneading to prevent crush or breakage of the resin. As a result, preparation of the Ag paste 14 containing the spacer resin having a particle size of about 10 µm is completed.

Figure 34:
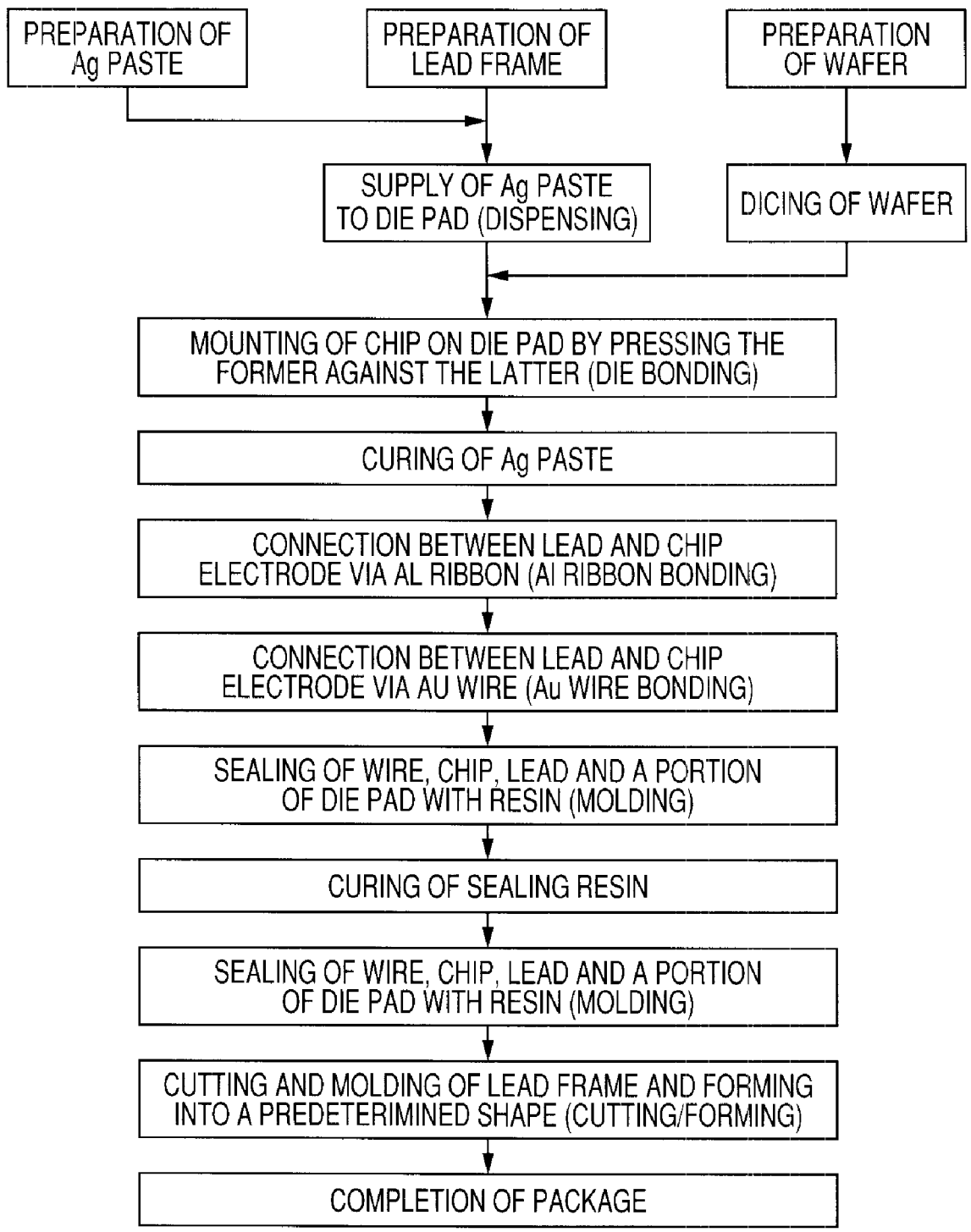
FIG. 34 is a flow chart showing the manufacturing steps of the semiconductor device according to Embodiment 4.

FIG. 34 is a flow chart of the manufacturing steps of the semiconductor device 1D (HWSON8) using this Ag paste 14. The Ag paste 14 is supplied onto the die pad portion 4D in a similar manner to that illustrated in FIGS. 15 and 16. An ordinary Ag paste supplying method can be employed. Also for the other manufacturing steps, conventional ones can be employed as they are.

Figure 35:
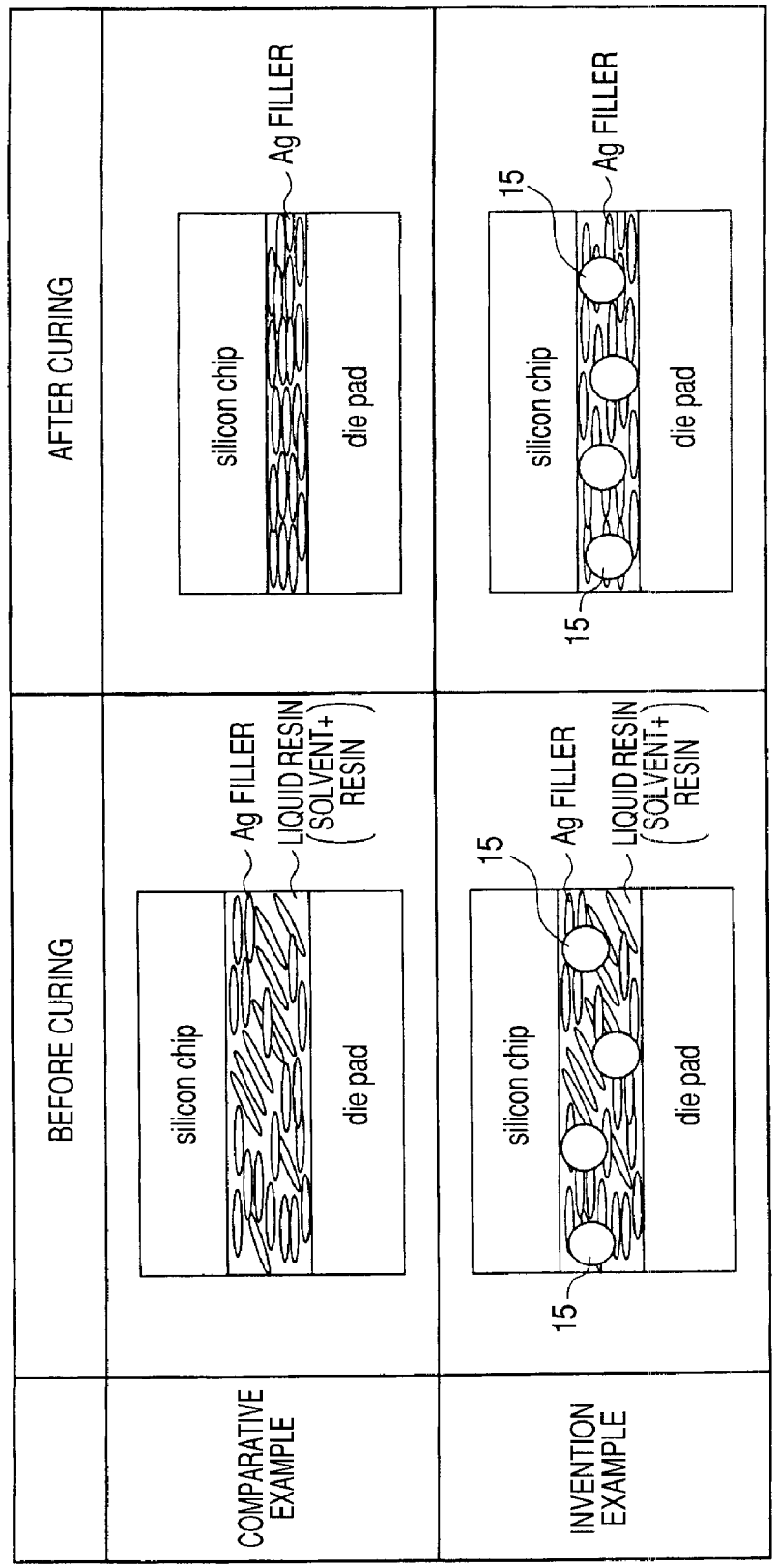
FIG. 35 is a schematic view showing the effect of the Ag paste used in Embodiment 4.

The effect produced by the Ag paste 14 containing the spacer resin will next be described referring to FIG. 35. As is apparent from the comparative example, when an Ag paste formed by filling an Ag filler in a liquid resin containing a resin and a solvent and serving as a base resin is cured, the film thickness of the Ag paste becomes thinner than the thickness before curing because of the shrinkage of the liquid resin and evaporation of the solvent. A decrease in the thickness of the Ag paste increases a deformation amount of the Ag paste due to ultrasonic oscillation energy during bonding using an Al ribbon, leading to an increase in the maximum stress. The term "maximum stress" as used herein means the maximum stress among stresses applied to the silicon chip 3A, the die pad portion 4D, and the Ag paste 14 interposed therebetween. Typically, a stress applied to a junction between the end portion of the silicon chip 3A and the Ag paste 14 becomes the maximum.

In the case of the Ag paste 14 of the invention containing the spacer resin 15 and having the above-described configuration, even if curing of a liquid resin containing a resin and a solvent and serving as a base resin leads to shrinkage of the base resin, the spacer resin 15 which has been cured in advance does not shrink so that the film thickness of the Ag paste 14 does not fall below the particle size of the spacer resin 15. As a result, the maximum stress applied to the Ag paste 14 during bonding using an Al ribbon becomes smaller, leading to improvement in the resistance against the ultrasonic oscillation applied during bonding using an Al ribbon. In addition, since the Ag paste 14 of this embodiment does not contain a thermoplastic resin, even application of high heat (about 260° C.) to the die pad portion 4D during a solder reflow step does not easily reduce the bulk strength of the resin.

Figure 36:
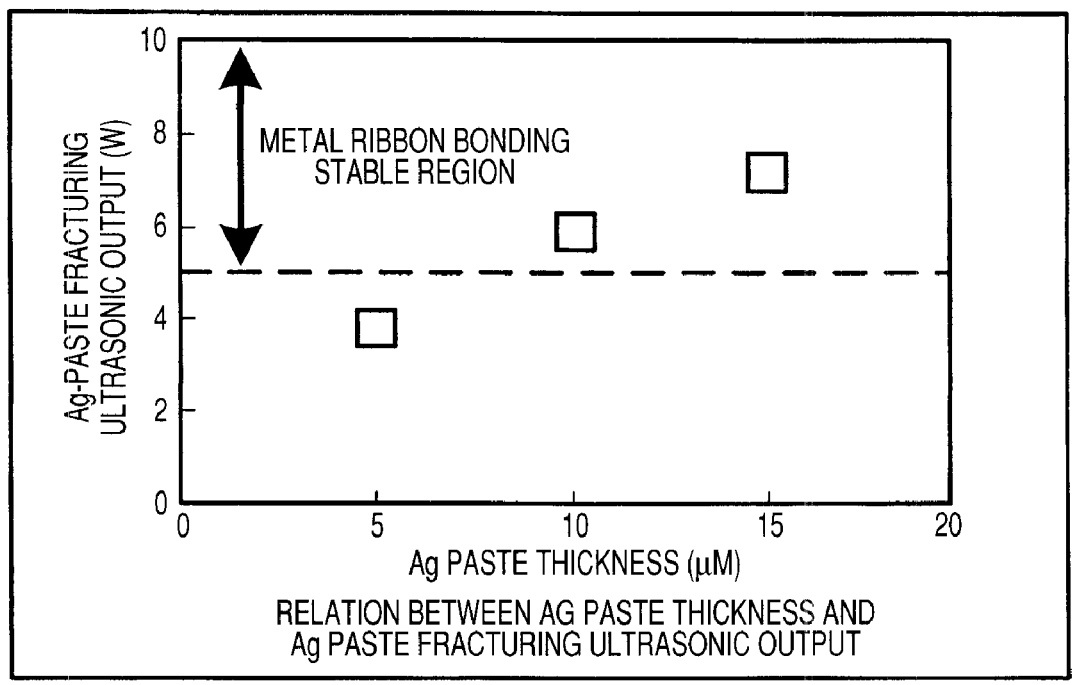
FIG. 36 is a graph showing the relationship between the thickness of the Ag paste and the Ag paste fracturing ultrasonic output.

FIG. 36 is a graph showing the relationship between the thickness of the Ag paste and the Ag paste fracturing ultrasonic output. The square in the drawing is an Ag paste fracturing ultrasonic output when the thickness of the Ag paste is 5 µm, 10 µm, or 20 µm. The term "Ag paste fracturing ultrasonic output" as used herein means a ultrasonic output causing fracture of an Ag paste during bonding using a metal ribbon. The term "metal ribbon bonding stable region" means a region where the Ag paste does not fracture by the ultrasonic oscillation energy (from about 5 W to 10 W) applied to the Ag paste during boding using a metal ribbon.

As is apparent from this graph, the Ag paste fracturing ultrasonic output when the Ag paste has a thickness of 5 µm is outside the metal ribbon bonding stable region and the metal ribbon bonding cannot be performed without fracturing an Ag paste. On the other hand, the Ag paste fracturing ultrasonic output when the Ag paste has a thickness of 10 µm or 15 µm is within the metal ribbon bonding stable region and the metal ribbon bonding can be performed without fracturing the Ag paste. As a result, the Ag paste containing the spacer resin 15 can secure an Ag paste thickness permitting the Ag paste fracturing ultrasonic output to fall within the metal ribbon bonding stable region.

Figure 37:
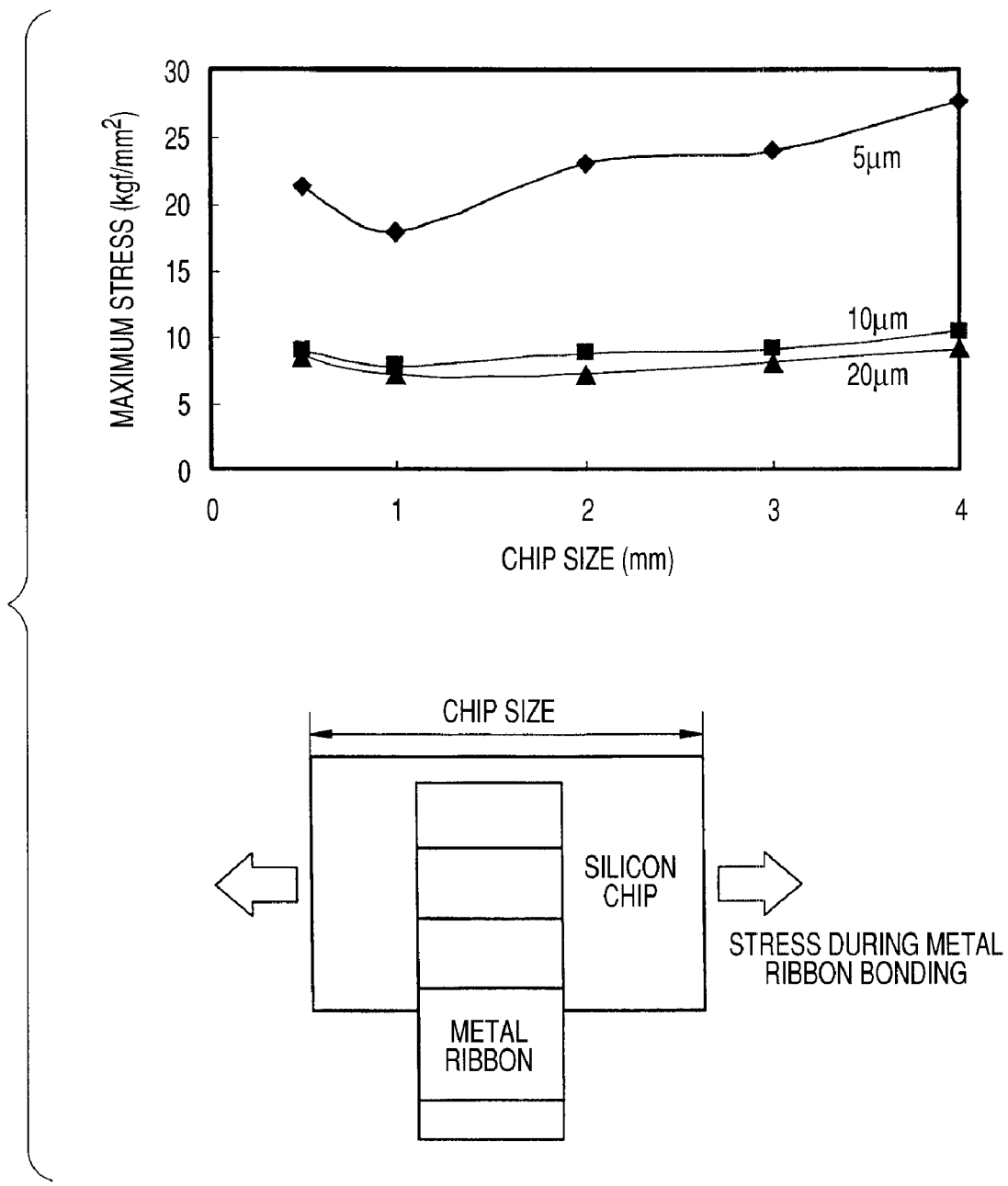
FIG. 37 is a graph showing the relationship between the thickness of the Ag paste and the maximum stress to be applied to the Ag paste during metal ribbon bonding.

FIG. 37 is a graph showing the relationship between the thickness of an Ag paste and a maximum stress to be applied to the Ag paste during metal ribbon bonding. The numerals (5 µm, 10 µm, and 20 µm) in the graph are each a thickness of the Ag paste. The term "chip size" as used herein means a length of the side of a chip in a direction parallel to the stress direction applied to the Ag paste. This graph has revealed that the maximum stress can be reduced irrespective of a chip size when the thickness of the Ag paste is from 10 µm to 20 µm.

The invention made by the present inventors have so far described specifically based on some embodiments. It should however be borne in mind that the invention is not limited to or by them. It is needless to say that various modifications or changes are possible without departing from the gist thereof.

In the embodiments, semiconductor devices applied to SOP8 or HWSON8 were described but they can also be applied to various packages for power semiconductors. A power element formed over a silicon chip is not limited to a power MOSFET but it may be, for example, an insulated gate bipolar transistor (IGBT).

In the invention, epoxy resins, acrylic resins, polyimide resins, polyester resins and the like are usable as the spacer resin. These resins have preferably elastic modulus of from 0.5 to 4 GPa.

The invention can be applied to a power semiconductor device to be used for a power control switch or a charge/discharge protection circuit switch of mobile information apparatuses.

What is claimed is:

1. A semiconductor device comprising:
    a lead frame having an obverse surface, a reverse surface opposite to the obverse surface, a die pad portion, and a first lead arranged in the vicinity of the die pad portion;
    a semiconductor chip mounted over the die pad portion with face up and having a first pad over a main surface of the semiconductor chip;
    a conductor for electrically coupling the first lead and the first pad; and
    a resin package for sealing therein the die pad portion, the semiconductor chip, the conductor, and the inner lead portion of the first lead,
    wherein an obverse surface of the die pad has a first porous metal layer formed using a plurality of Ag nanoparticles,
    wherein the die pad portion is bonded to a back surface of the semiconductor chip via an Ag paste,
    wherein a size of the Ag nanoparticles is smaller than a size of an Ag filler of the Ag paste, and
    wherein an epoxy resin of the Ag paste penetrates between each said Ag nanoparticle.
2. The semiconductor device according to claim 1, wherein the Ag nanoparticles comprising the first porous metal layer have an average particle size of from 1 nm to 50 nm.

3. The semiconductor device according to claim 1,
wherein the conductor for electrically coupling the first lead and the first pad is a metal ribbon.

4. The semiconductor device according to claim 3,
wherein a power MOSFET is formed over the semiconductor chip and the first pad comprises a source electrode of the power MOSFET.

5. The semiconductor device according to claim 4,
wherein a drain electrode of the power MOSFET is formed over the back surface of the semiconductor chip.

6. The semiconductor device according to claim 1,
wherein a second porous metal layer formed using the Ag nanoparticles is formed over the back surface of the semiconductor chip.

7. The semiconductor device according to claim 6,
wherein the Ag nanoparticles comprising the second porous metal layer have an average particle size of from 1 nm to 50 nm.

8. A semiconductor device comprising:
a lead frame having a die pad portion and a first lead arranged in the vicinity of the die pad portion;
a semiconductor chip mounted over the die pad portion with face up and having a first pad over a main surface of the chip;
a conductor for electrically coupling the first lead and the first pad; and
a resin package for sealing therein the die pad portion, the semiconductor chip, the conductor, and the inner lead portion of the first lead,
wherein a porous metal layer formed using a plurality of Ag nanoparticles is formed over at least one of a surface of the lead frame and a back surface of the semiconductor chip,
wherein the die pad portion is bonded to the back surface of the semiconductor chip via the porous metal layer, and
wherein an epoxy resin penetrates between each said Ag nanoparticle.

9. The semiconductor device according to claim 8,
wherein the Ag nanoparticles comprising the porous metal layer have an average particle size of from 1 nm to 50 nm.

10. The semiconductor device according to claim 8,
wherein the conductor for electrically coupling the first lead and the first pad is a metal wire or a metal ribbon.

11. The semiconductor device according to claim 8,
wherein a power MOSFET is formed over the semiconductor chip and the first pad comprises a source electrode of the power MOSFET.

12. The semiconductor device according to claim 11,
wherein a drain electrode of the power MOSFET is formed over the back surface of the semiconductor chip.

13. A semiconductor device comprising:
a lead frame having a die pad portion and a first lead arranged in the vicinity of the die pad portion;
a semiconductor chip mounted over the die pad portion with face up and having a first pad over a main surface of the semiconductor chip;
a conductor for electrically coupling the first lead and the first pad; and
a resin package for sealing the die pad portion, the semiconductor chip, the conductor, and the inner lead portion of the first lead,
wherein the die pad portion and a back surface of the semiconductor chip are adhered via an Ag paste containing an Ag filler, a first thermosetting resin serving as a base resin, and a spacer resin comprised of a second thermosetting resin, and
wherein a particle size of the spacer resin is from 8 μm to 20 μm.

14. The semiconductor device according to claim 13,
wherein the conductor for electrically coupling the first lead and the first pad is a metal ribbon.

15. The semiconductor device according to claim 14,
wherein a power MOSFET is formed over the semiconductor chip,
wherein the first pad comprises a source electrode of the power MOSFET, and
wherein a drain electrode of the power MOSFET is formed over the back surface of the semiconductor chip.

\* \* \* \* \*